(12) United States Patent
Taniguchi et al.

(10) Patent No.: US 8,941,286 B2
(45) Date of Patent: Jan. 27, 2015

(54) ACOUSTIC WAVE DEVICE

(71) Applicant: Taiyo Yuden Co., Ltd., Tokyo (JP)

(72) Inventors: Shinji Taniguchi, Tokyo (JP); Tokihiro Nishihara, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 239 days.

(21) Appl. No.: 13/734,188

(22) Filed: Jan. 4, 2013

(65) Prior Publication Data

US 2013/0207515 A1 Aug. 15, 2013

(30) Foreign Application Priority Data

Feb. 14, 2012 (JP) .................................. 2012-029958
Jul. 31, 2012 (JP) .................................. 2012-170269

(51) Int. Cl.
*H03H 9/00* (2006.01)
*H01L 41/09* (2006.01)
(52) U.S. Cl.
USPC ............ 310/320; 310/346; 310/369; 333/197
(58) Field of Classification Search
USPC .......... 310/320, 324, 346, 365, 369; 333/187, 333/189
See application file for complete search history.

(56) References Cited

U.S. PATENT DOCUMENTS

| | | | |
|---|---|---|---|
| 7,019,605 B2 * | 3/2006 | Larson, III ..................... | 333/187 |
| 7,362,198 B2 * | 4/2008 | Larson et al. .................. | 333/187 |
| 8,222,970 B2 * | 7/2012 | Inoue et al. .................... | 333/133 |
| 2003/0033700 A1 * | 2/2003 | Takeuchi et al. .............. | 29/25.35 |
| 2011/0266925 A1 | 11/2011 | Ruby et al. | |
| 2013/0038405 A1 * | 2/2013 | Taniguchi et al. ............ | 333/133 |

FOREIGN PATENT DOCUMENTS

| | | |
|---|---|---|
| JP | 60-16010 A | 1/1985 |
| JP | 64-48694 A | 2/1989 |

OTHER PUBLICATIONS

Allah et al., "Temperature Compensated Solidly Mounted Resonators with thin SiO2 layers", Proc. IEEE International Ultrasonics Symposium 2009, pp. 859-862 (Mentioned on paragraph No. 4 of the as-filed specification.).

Lakin et al., "Temperature Compensated Bulk Acoustic Thin Film Resonators", IEEE Ultrasonics Symposium 2000, pp. 855-858.

\* cited by examiner

*Primary Examiner* — Thomas Dougherty
(74) *Attorney, Agent, or Firm* — Chen Yoshimura LLP

(57) ABSTRACT

An acoustic wave device includes: a piezoelectric thin film resonator including: a substrate; a lower electrode formed on the substrate; at least two piezoelectric films formed on the lower electrode; an insulating film sandwiched by the at least two piezoelectric films; and an upper electrode formed on the at least two piezoelectric films, wherein an area of the insulating film within a resonance region, in which the lower electrode and the upper electrode face each other across the at least two piezoelectric films, is different from an area of the resonance region.

20 Claims, 30 Drawing Sheets

ACOUSTIC WAVE DEVICE

CROSS-REFERENCE TO RELATED APPLICATION

This application is based upon and claims the benefit of priority of the prior Japanese Patent Application Nos. 2012-029958 and 2012-170269, filed on Feb. 14, 2012 and Jul. 31, 2012 respectively, the entire contents of which are incorporated herein by reference.

FIELD

A certain aspect of the present invention relates to an acoustic wave device, and for example, to an acoustic wave device including a piezoelectric thin film resonator.

BACKGROUND

Acoustic wave devices using piezoelectric thin film resonators are used as filters of wireless devices for example. The piezoelectric thin film resonator has a structure in which a lower electrode and an upper electrode face each other across a piezoelectric film. Filters and duplexers are examples of the acoustic wave device using the piezoelectric thin film resonator. The piezoelectric film, lower electrode and upper electrode of the piezoelectric thin film resonator generally have negative temperature coefficients of elastic constants. This shifts a resonance frequency of the piezoelectric thin film resonator to a low frequency side with increase in temperature. As described above, the resonance frequency, anti-resonance frequency or frequencies of a passband vary with temperature in the above described acoustic wave devices.

There has been known a piezoelectric thin film resonator including a temperature compensation film inserted into a multilayered film to suppress a frequency change due to temperature, where the temperature compensation film is an insulating film such as a silicon oxide film having a temperature coefficient opposite to those of the piezoelectric film, lower electrode and upper electrode, as disclosed in Japanese Patent Application Publication No. 1-48694 and Proc. IEEE Ultrasonics Symposium 2009, pp 859-862.

There has been known a structure in which electrodes mutually short-circuited are located on upper and lower surfaces of a temperature compensation film to suppress a reduction in excitation efficiency caused by a concentration of electric field in the temperature compensation film when the temperature compensation film is used, as disclosed in Japanese Patent Application Publication No. 60-16010. There has been known a piezoelectric thin film resonator including a temperature compensation film embedded in the lower electrode, as disclosed in U.S. Patent Application Publication No. 2011/0266925.

However, the above described techniques improve temperature characteristics, including a resonance frequency, of the piezoelectric thin film resonator but degrade resonance characteristics including an electromechanical coupling coefficient. The temperature characteristics have a trade-off relationship with the resonance characteristics. This makes piezoelectric thin film resonators included in a single chip to have uniform temperature characteristics and resonance characteristics. Therefore, design flexibility is limited. For example, when resonators are formed so as to have insulating films of different thicknesses, the resonators can have different temperature characteristics and resonance characteristics. However, this increases the number of fabrication steps.

In addition, the effective electromechanical coupling coefficient decreases in the piezoelectric thin film resonator using the temperature compensation film when the temperature compensation film is thickened to improve the temperature characteristics. For example, the thickening of the temperature compensation film improves the temperature characteristics but degrades matching in a passband in a filter using the piezoelectric thin film resonator, or increases a loss within the passband. As described above, the temperature characteristics have a trade-off relationship with the effective electromechanical coupling coefficient. Therefore, it is difficult to control the temperature characteristics and electrical characteristics with respect to each of the piezoelectric thin film resonators in a single acoustic wave device.

SUMMARY OF THE INVENTION

According to an aspect of the present invention, there is provided an acoustic wave device including: a piezoelectric thin film resonator including: a substrate; a lower electrode formed on the substrate; at least two piezoelectric films formed on the lower electrode; an insulating film sandwiched by the at least two piezoelectric films; and an upper electrode formed on the at least two piezoelectric films, wherein an area of the insulating film within a resonance region, in which the lower electrode and the upper electrode face each other across the at least two piezoelectric films, is different from an area of the resonance region.

According to another aspect of the present invention, there is provided an acoustic wave device including: a piezoelectric thin film resonator including: a substrate; a lower electrode formed on the substrate; at least two piezoelectric films formed on the lower electrode; an insulating film sandwiched by the at least two piezoelectric films; and an upper electrode formed on the at least two piezoelectric films, wherein the insulating film within a resonance region, in which the lower electrode and the upper electrode face each other across the at least two piezoelectric films, has a concave portion and a convex portion.

According to another aspect of the present invention, there is provided an acoustic wave device including: a piezoelectric thin film resonator including: a substrate; a piezoelectric film located on the substrate; a lower electrode and an upper electrode that face each other across the piezoelectric film; a temperature compensation film having a temperature coefficient of elastic constant opposite in sign to a temperature coefficient of elastic constant of the piezoelectric film; and conductive films formed on an upper surface and an lower surface of the temperature compensation film, and mutually electrically short-circuited, wherein an area of the temperature compensation film within a resonance region, in which the lower electrode and the upper electrode facing each other across the piezoelectric film, is different from an area of the resonance region.

DETAILED DESCRIPTION

Hereinafter, a description will be given of embodiments of the present invention with reference to the drawings.

First Embodiment

Figure 1A:
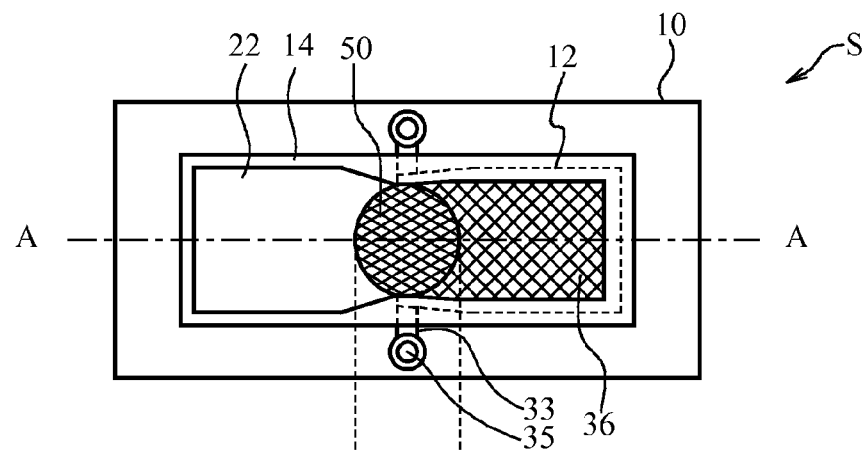
FIG. 1A is a plain view of a piezoelectric thin film resonator in accordance with a first embodiment.
Figure 1B:
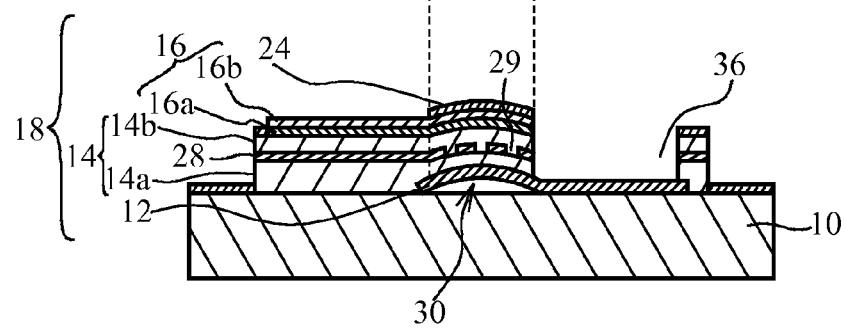
FIG. 1B and FIG. 1C are cross-sectional views taken along line A-A in FIG. 1A.
Figure 1C:
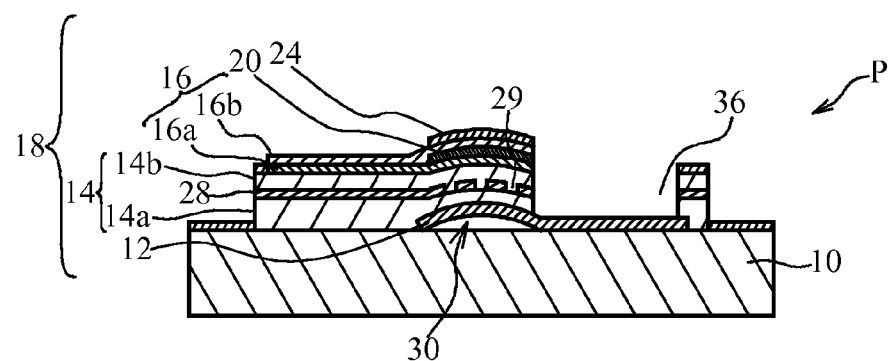

A first embodiment is an exemplary piezoelectric thin film resonator used in an acoustic wave device. FIG. 1A is a plain view of a piezoelectric thin film resonator in accordance with the first embodiment, and FIG. 1B and FIG. 1C are cross-sectional views taken along line A-A in FIG. 1A. FIG. 1B is a cross-sectional view of a series resonator in, for example, a ladder-type filter, and FIG. 1C is a cross-sectional view of a parallel resonator in the ladder-type filter.

A description will be given of a structure of a series resonator S with reference to FIG. 1A and FIG. 1B. A lower electrode 12 is located on a substrate 10, which is an Si substrate, so that a dome-shaped space 30 is formed between a flat principal surface of the substrate 10 and the lower electrode 12. The dome-shaped space 30 has a height which is low near a peripheral portion of the space 30 and becomes higher as closer to a central portion of the space 30, for example. The lower electrode 12 includes a Cr (chrome) layer and an Ru (ruthenium) layer formed on the Cr layer.

Located on the lower electrode 12 is a piezoelectric film 14 mainly including aluminum nitride (AlN) having a main direction of (002) direction. The piezoelectric film 14 includes at least two piezoelectric films 14a and 14b. An insulating film 28 mainly including a silicon oxide film is sandwiched by the at least two piezoelectric films 14a and 14b. The piezoelectric films 14a and 14b are two piezoelectric films, and the insulating film 28 is a single insulating film in the first embodiment.

An upper electrode 16 is located on the piezoelectric film 14. A resonance region 50 is a region in which the lower electrode 12 and the upper electrode 16 face each other across the piezoelectric film 14. The resonance region 50 has an ellipsoidal shape, and is a region in which an acoustic wave in a thickness longitudinal oscillation mode resonates. The upper electrode 16 includes an Ru layer 16a (hereinafter, also referred to as a lower layer) and a Cr layer 16b (hereinafter, also referred to as an upper layer) formed on the Ru layer 16a.

A silicon oxide film is formed on the upper electrode 16 as a frequency adjusting film 24. A multilayered film 18 includes the lower electrode 12, the piezoelectric film 14, the insulating film 28 (hereinafter, also referred to as a temperature compensation film), the upper electrode 16, and the frequency adjusting film 24. The frequency adjusting film 24 may function as a passivation film.

As illustrated in FIG. 1A, an introduction path 33 for etching a sacrifice layer is formed in the lower electrode 12. The sacrifice layer is a layer for forming the space 30. An end portion of the introduction path 33 is not covered with the piezoelectric film 14, and the lower electrode 12 has a hole portion 35 at an end of the introduction path 33. As illustrated in FIG. 1A and FIG. 1B, an aperture 36 is formed in the piezoelectric film 14 to provide an electrical connection with the lower electrode 12. A base film for a bump such as Au may be located on the lower electrode 12 located at a bottom of the aperture 36 to provide an external connection.

A description will be given of a structure of a parallel resonator P with reference to FIG. 1A and FIG. 1C. The parallel resonator P includes a mass load film 20 including a Ti (titanium) layer between the Ru layer 16a and the Cr layer 16b as compared to the series resonator S. Thus, the multi-layered film 18 includes the mass load film 20 formed over the entire surface within the resonance region 50 in addition to the multilayered film of the series resonator S. Other structures are the same as those of the series resonator S illustrated in FIG. 1B, and a description is omitted.

The film thickness of the mass load film 20 is used to adjust a difference in resonance frequency between the series resonator S and the parallel resonator P. The film thickness of the frequency adjusting film 24 is used to adjust resonance frequencies of the series resonator S and the parallel resonator P.

As illustrated in FIG. 1A through FIG. 1C, the first embodiment forms an aperture 29 in the insulating film 28 within the resonance region 50. That is to say, the insulating film 28 within the resonance region 50 has a shape different from that of the resonance region 50 when observed from an upper direction.

When the piezoelectric thin film resonator has a resonance frequency of 2 GHz, the Cr layer in the lower electrode 12 has a film thickness of 100 nm, the Ru layer has a film thickness of 170 nm, and each of the piezoelectric films 14a and 14b formed of AlN layers has a film thickness of 600 nm. The insulating film 28 formed of a silicon oxide film has a film thickness of 60 nm. The Ru layer 16a has a film thickness of 200 nm, and the Cr layer 16b has a film thickness of 20 nm. The mass load film 20 including the Ti layer has a film thickness of 100 nm. The film thickness of each layer may be set arbitrarily to obtain a desired resonance frequency.

The lower electrode 12 and the upper electrode 16 may be made of a single layer metal film such as Al (aluminum), Cu (copper), Mo (molybdenum), W (tungsten), Ta (tantalum), Pt (platinum), Rh (rhodium), or Ir (iridium), or of a composite film of these besides Cr and Ru. The mass load film 20 may be made of a single layer metal film such as Ru, Cr, Al, Cu, Mo, W, Ta, Pt, Rh, or Ir, or of a composite film of these besides Ti. The mass load film 20 may be also made of an insulating film made of metal nitride such as silicon nitride or metal oxide such as silicon oxide. Furthermore, the mass load film 20 may be made of the same film as the upper electrode 16 or the lower electrode 12. A metal film is preferably used for the mass load film 20 to reduce a resistance when the mass load film 20 is formed below the lower electrode 12, between layers of the lower electrode 12, between layers of the upper electrode 16, on the upper electrode 16, between the lower electrode 12 and the piezoelectric film 14, or between the piezoelectric film 14 and the upper electrode 16. In addition, the mass load film 20 may be larger than the resonance region 50 as long as formed so as to include the resonance region 50.

The substrate 10 may be a quartz substrate, a glass substrate, a ceramic substrate or a GaAs substrate besides the Si substrate. The piezoelectric film 14 may be made of ZnO (zinc oxide), PZT (lead zirconate titanate), or PbTiO$_3$ (lead titanate) besides aluminum nitride. In addition, the piezoelectric film 14 may mainly include aluminum nitride, and additionally include another element to improve the resonance characteristics and temperature characteristics. The insulating film 28 may be made of silicon nitride (e.g. Si$_3$N$_4$) besides silicon oxide film (e.g. SiO$_2$). For example, the insulating film 28 may mainly include silicon oxide or silicon nitride, and additionally include another element to improve the resonance characteristics and the temperature dependence.

Figure 2A:
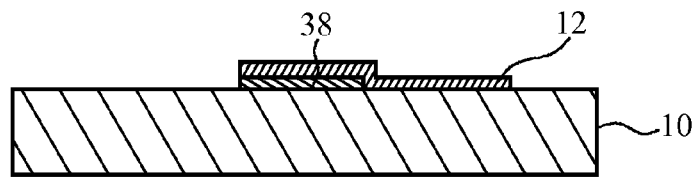
FIG. 2A through FIG. 2D are cross-sectional views illustrating a fabrication method of the piezoelectric thin film resonator in accordance with the first embodiment.

FIG. 2A through FIG. 2D are cross-sectional views illustrating a fabrication method of the piezoelectric thin film resonator of the first embodiment. As illustrated in FIG. 2A, formed is a sacrifice layer 38 for forming a space above the substrate 10 having the flat principal surface. The sacrifice layer 38 has a film thickness of 10 to 100 nm for example, and is made of a material, such as MgO, ZnO, Ge, or SiO$_2$, that is easily dissolved in an etching liquid or an etching gas. The sacrifice layer 38 is then patterned by photolithography and etching. The sacrifice layer 38 has a shape corresponding to a planar shape of the space 30, and includes at least the resonance region 50 for example. In the next step, the lower electrode 12 is formed on the sacrifice layer 38 and the substrate 10. The sacrifice layer 38 and the lower electrode 12 are formed by sputtering, vacuum evaporation, or chemical vapor deposition (CVD), for example. The lower electrode 12 is then patterned into a desired shape by photolithography and etching. The lower electrode 12 may be formed by liftoff.

Figure 2B:
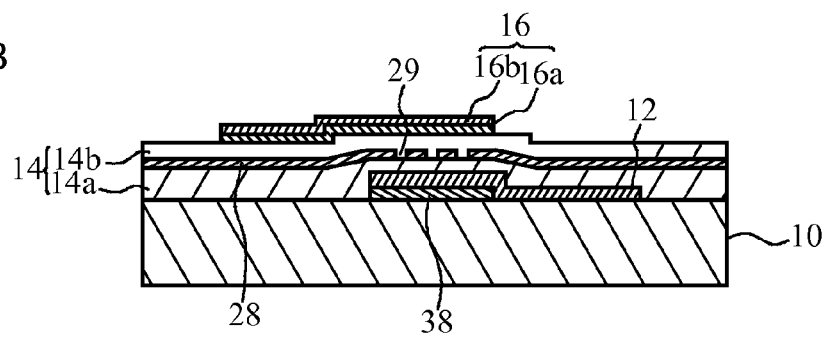

As illustrated in FIG. 2B, the piezoelectric film 14a, the insulating film 28, the piezoelectric film 14b and the upper electrode 16 are formed on the lower electrode 12 and the substrate 10 in this order from the substrate 10 side by sputtering, vacuum evaporation, or CVD, for example. The upper electrode 16 is patterned into a desired shape by photolithography and etching. The upper electrode 16 may be formed by liftoff. In the parallel resonator P illustrated in FIG. 1C, the Ru layer 16a is formed, and the mass load film 20 is then formed by sputtering, vacuum evaporation, or CVD, for example. The mass load film 20 is patterned into a desired shape by photolithography and etching. The mass load film 20 of the series resonator S is removed at this point. The Cr layer 16b is then formed on the mass load film 20 and the Ru layer 16a.

Figure 2C:
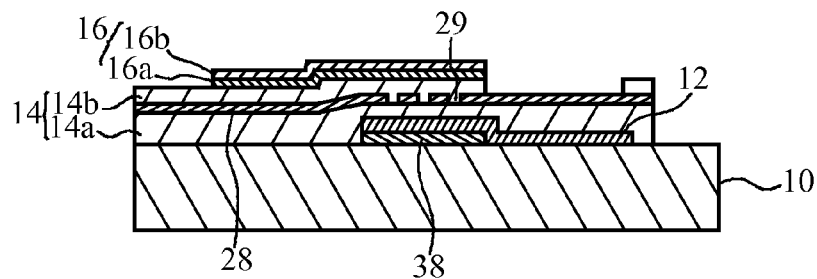

As illustrated in FIG. 2C, the piezoelectric film 14b is patterned into a desired shape by photolithography and etching. The piezoelectric film 14b is etched using a solution including, for example, phosphoric acid. At this point, at least a part of an outer periphery of the piezoelectric film 14b may be located further in than an outer periphery of the upper electrode 16.

Figure 2D:
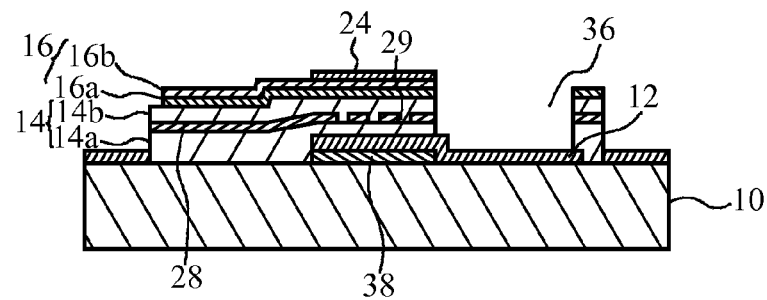

As illustrated in FIG. 2D, the frequency adjusting film 24 is formed by sputtering or CVD, for example. The frequency adjusting film 24 is patterned into a desired shape by photolithography and etching. In the next step, the insulating film 28 and the piezoelectric film 14a are patterned into a desired shape by photolithography and etching. This process exposes the lower electrode 12 to the aperture 36. Thus, a bump such as Au can be electrically connected to the lower electrode 12 through the aperture 36.

The etching liquid for the sacrifice layer 38 is then introduced into the sacrifice layer 38 below the lower electrode 12 through the hole portion 35 and the introduction path 33 (see FIG. 1A). This process removes the sacrifice layer 38. A medium for etching the sacrifice layer 38 is preferably a medium that does not etch materials constituting the resonator except the sacrifice layer 38. In particular, the etching medium is preferably a medium that does not etch the lower electrode 12 with which the etching medium contacts. A stress of the multilayered film 18 is set to be a compression stress. This makes the multilayered film 18 separate from the substrate 10 and bulge out toward an opposite side to the substrate 10 when the sacrifice layer 38 is removed. The dome-shaped space 30 is formed between the lower electrode 12 and the substrate 10. The above described process completes the series resonator S.

Figure 3A:
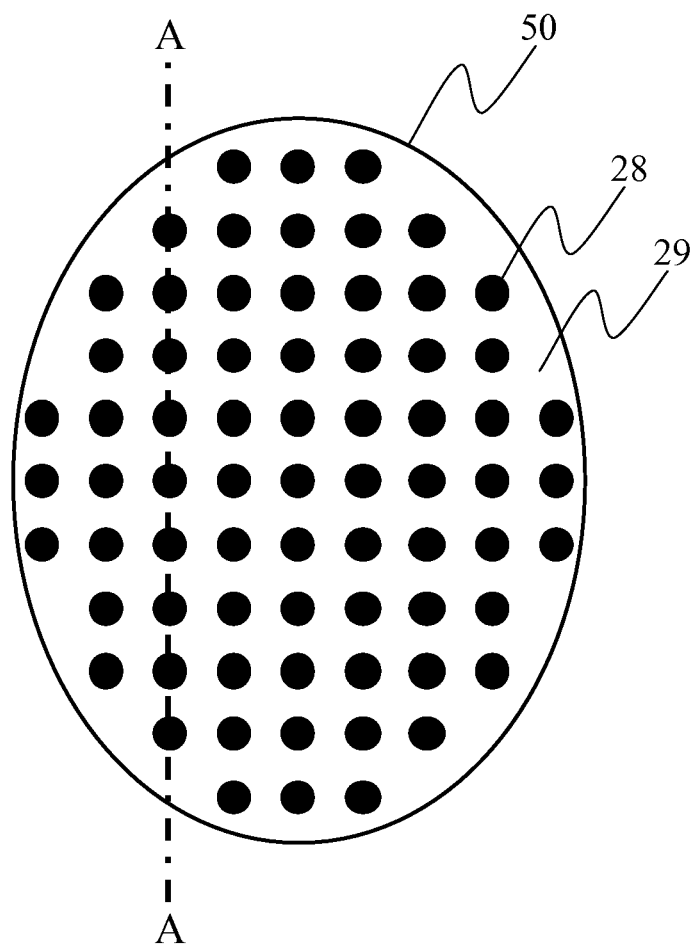
FIG. 3A is a plain view of an exemplary insulating film.
Figure 3B:
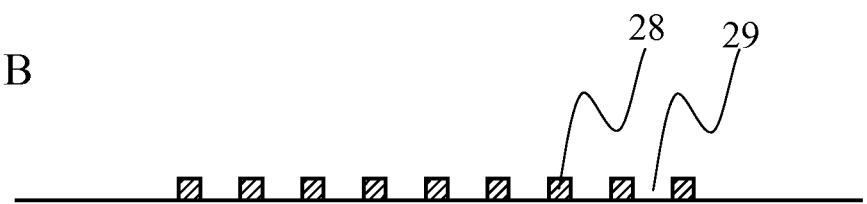
FIG. 3B is a cross-sectional view taken along line A-A in FIG. 3A.

A description will now be given of a shape of the insulating film 28. FIG. 3A is a plain view of an exemplary insulating film, and FIG. 3B is a cross-sectional view taken along line A-A in FIG. 3A. As illustrated in FIG. 3A and FIG. 3B, the insulating film 28 is formed to be island-shaped within the resonance region 50. A region in which the insulating film 28 is not formed is the aperture 29. The island-shaped insulating film 28 forms a dot pattern having circular dots arranged regularly or periodically.

Figure 4A:
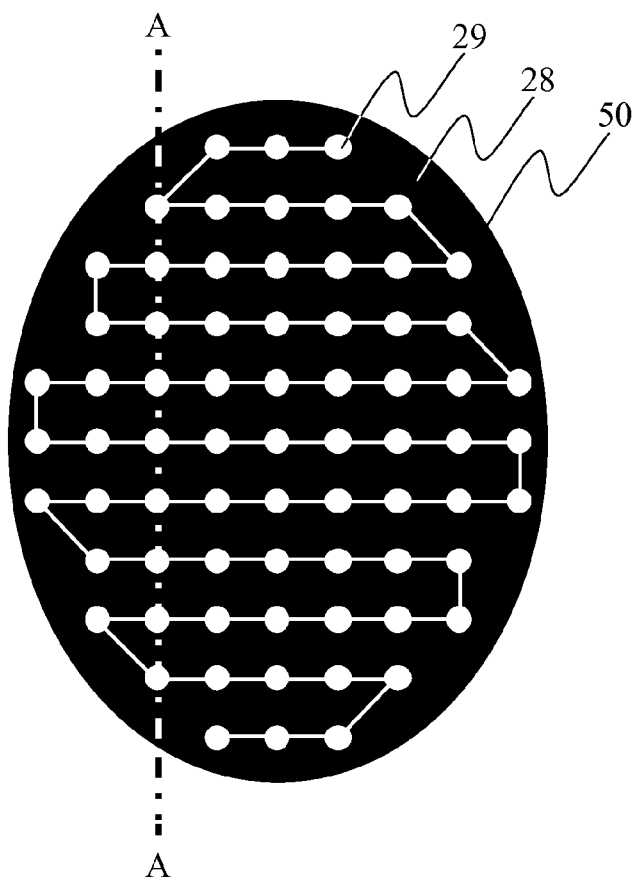
FIG. 4A is a plain view of another exemplary insulating film.
Figure 4B:
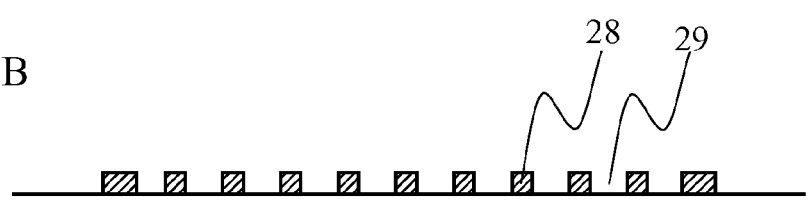
FIG. 4B is a cross-sectional view taken along line A-A in FIG. 4A.

FIG. 4A is a plain view of another exemplary insulating film, and FIG. 4B is a cross-sectional view taken along line A-A in FIG. 4A. As illustrated in FIG. 4A and FIG. 4B, the insulating film 28 is formed to have the apertures 29 within the resonance region 50. The apertures 29 form a dot pattern having circular dots arranged regularly or periodically. The dots of the dot pattern are interlinked by a line pattern. The line pattern is formed in a zig-zag manner.

Figure 5A:
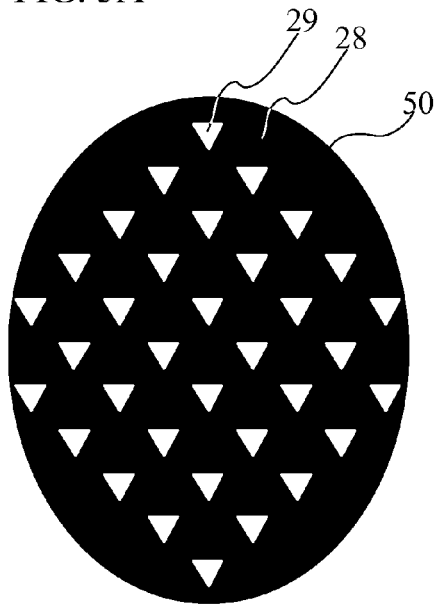
FIG. 5A through FIG. 5D are plain views of other exemplary insulating films.
Figure 5B:
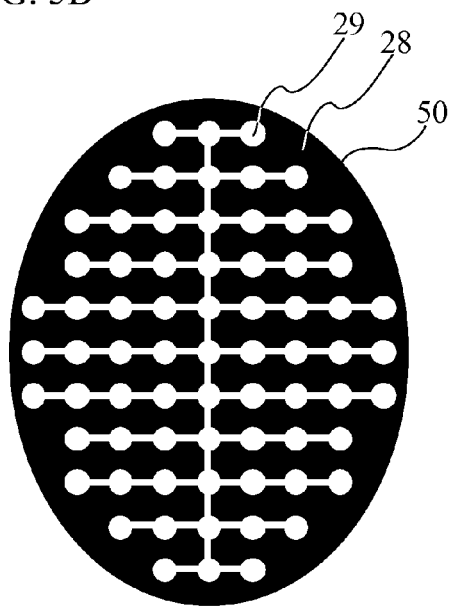
Figure 5C:
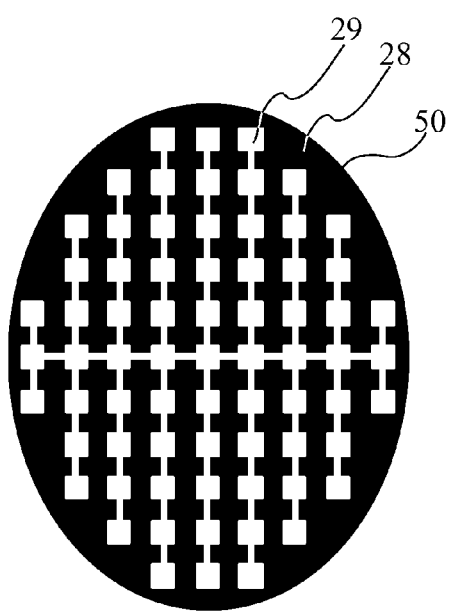
Figure 5D:
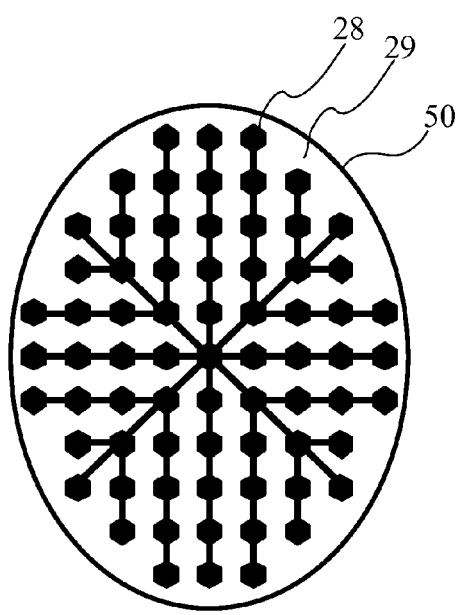

FIG. 5A through FIG. 6D are plain views of other exemplary insulating films. As illustrated in FIG. 5A, the dot pattern of the apertures 29 may have triangular dots. As illustrated in FIG. 5B, the line pattern may interlink the dots of the dot pattern on a major axis, and interlink the dots of the dot pattern in a minor axis direction. As illustrated in FIG. 5C, the dot pattern may have rectangular dots. The line pattern may interlink the dots of the dot pattern on the minor axis, and interlink the dots of the dot pattern in the major axis direction. As illustrated in FIG. 5D, the dot pattern may have hexagonal dots, and the line pattern may interlink the dots of the dot pattern radially.

Figure 6A:
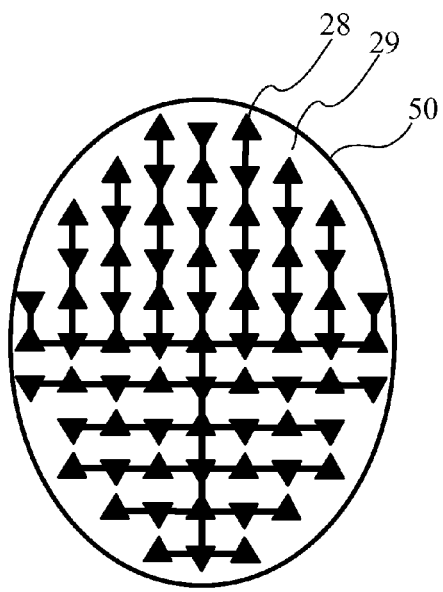
FIG. 6A through FIG. 6D are plain views of other exemplary insulating films.
Figure 6B:
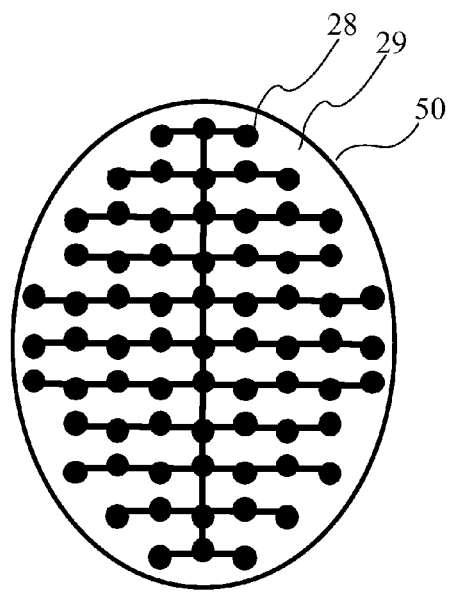
Figure 6C:
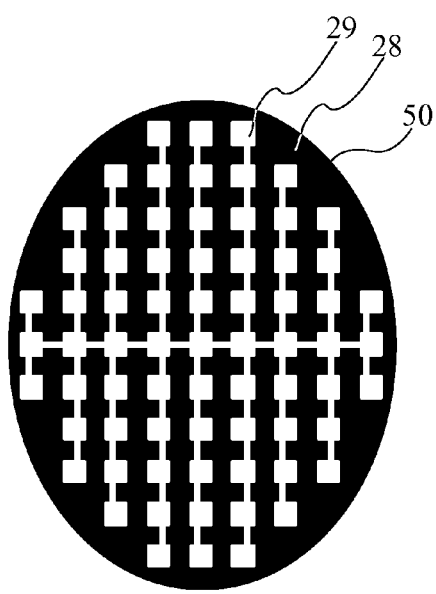
Figure 6D:
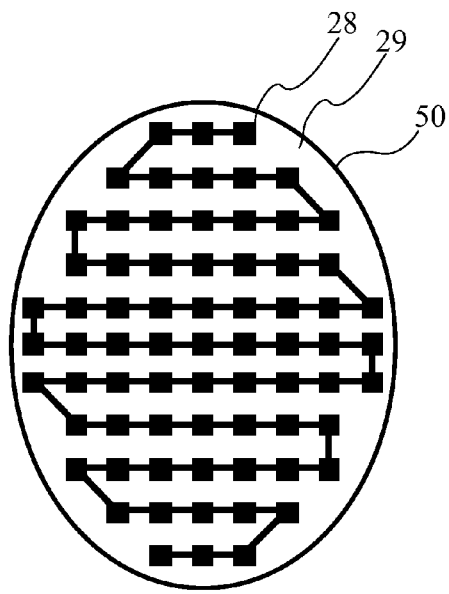

As illustrated in FIG. 6A, the dot pattern may have triangular dots. The line pattern may interlink the dots of the dot pattern in the main axis direction in the upper half of the resonance region 50, and interlink the dots of the dot pattern in the minor axis direction in the lower half of the resonance region 50. As illustrated in FIG. 6B, although the line pattern has the same shape as that in FIG. 5B, the positions of the dots of the dot pattern may alternately shift from the line pattern in the major axis direction. As illustrated in FIG. 6C, although the dot pattern has the same shape as that in FIG. 5C, the positions of the line pattern may alternately shift in the minor axis direction. As illustrated in FIG. 6D, the line pattern may interlink the dots of the dot pattern in a zig-zag manner, and the dot pattern may have rectangular dots. The insulating film 28 and the aperture 29 may be formed to have a complementary relationship to those in FIG. 5A through FIG. 6D.

As described above, the island-shaped insulating film 28 may be formed, or the insulating film 28 having the apertures 29 may be formed within the resonance region 50. The insulating film 28 within the resonance region 50 has a shape different from that of the resonance region 50 in both cases. An area ratio A1/A0, which is a ratio of an area A1 of the insulating film 28 within the resonance region 50 to an area A0 of the resonance region 50, is lower than 1 and higher than 0. The island-shaped insulating film 28 is formed when the area ratio A1/A0 is made to be lower than or equal to a given value. The insulating film 28 having the apertures is formed when the area ratio A1/A0 is made to be higher than or equal to the given value. For example, the island-shaped insulating film 28 is formed when the area ratio A1/A0 is higher than 0 and lower than or equal to 0.5, and the insulating film 28 having the apertures is formed when the area ratio A1/A0 is higher than or equal to 0.5 and lower than 1.

Figure 7A:
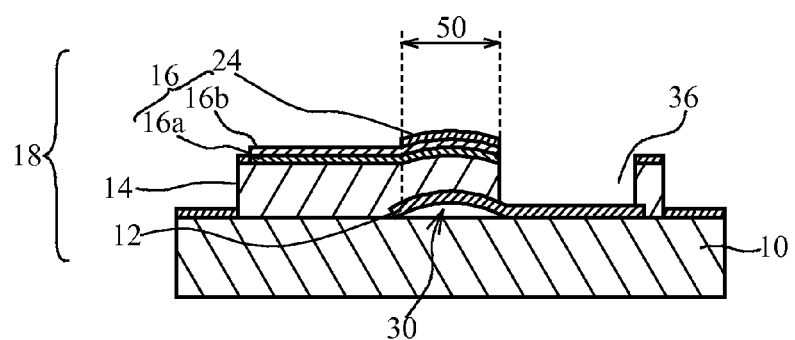
FIG. 7A and FIG. 7B are cross-sectional views of piezoelectric thin film resonators in accordance with first and second comparative examples respectively.
Figure 7B:
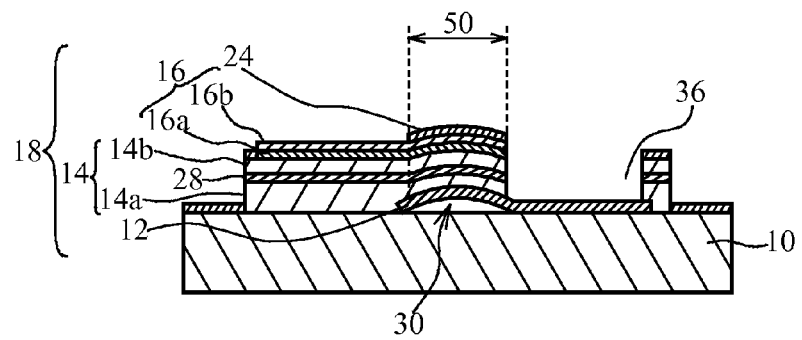

Hereinafter, a description will be given of advantages of the first embodiment. FIG. 7A and FIG. 7B are cross-sectional views of piezoelectric thin film resonators in accordance with first and second comparative examples respectively. As illustrated in FIG. 7A, the insulating film 28 is not formed in the piezoelectric thin film resonator of the first comparative example. Other structures are the same as those of the first embodiment illustrated in FIG. 1B, and a description is omitted. As illustrated in FIG. 7B, the aperture 29 is not formed in the insulating film 28 in the piezoelectric thin film resonator of the second comparative example. Other structures are the same as those of the first embodiment illustrated in FIG. 1B, and a description is omitted. The piezoelectric film 14 has a film thickness of 1200 nm in the first comparative example. The film thicknesses and materials of other films of the first and second comparative examples are the same as those of the exemplary piezoelectric thin film resonator having a resonance frequency of 2 GHz described in FIG. 1A and FIG. 1B. The resonance region 50 has an ellipsoidal shape with a major axis of 175 μm and a minor axis of 110 μm.

Figure 8A:
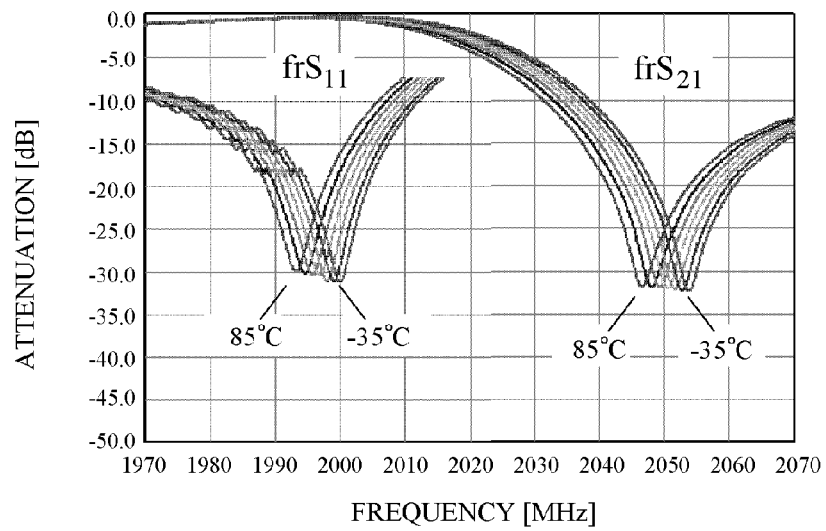
FIG. 8A and FIG. 8B illustrate temperature dependences of resonance frequencies and anti-resonance frequencies of the piezoelectric thin film resonators in accordance with the first comparative example and the second comparative example respectively.
Figure 8B:
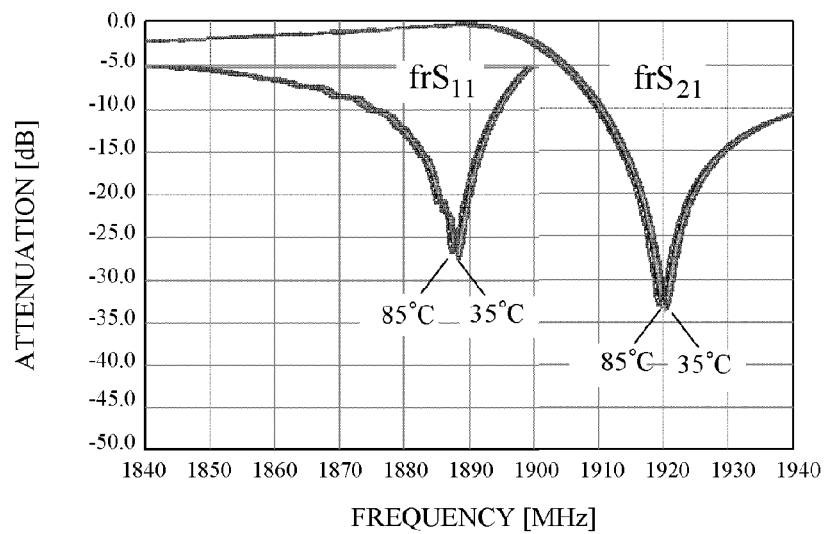

FIG. 8A and FIG. 8B illustrate temperature dependences of resonance frequencies and anti-resonance frequencies of the piezoelectric thin film resonators in accordance with the first and second comparative examples respectively. A resonance frequency fr is obtained by measuring a reflection characteristic S11 of the resonator. An anti-resonance frequency fa is obtained by measuring a pass characteristic S21 of the resonator. FIG. 8A and FIG. 8B illustrate measurement results of the S11 and the S21 of the resonators measured at intervals of 20° C. from −35 to 85° C. FIG. 8A and FIG. 8B demonstrate temperature coefficients of resonance frequencies and anti-resonance frequencies of the first and second comparative examples as follows.

The First Comparative Example

| | |
|---|---|
| Temperature coefficient of resonance frequency | −29.6 ppm/° C. |
| Temperature coefficient of anti-resonance frequency | −31.0 ppm/° C. |

The Second Comparative Example

| | |
|---|---|
| Temperature coefficient of resonance frequency | −5.2 ppm/° C. |
| Temperature coefficient of anti-resonance frequency | −6.3 ppm/° C. |

As presented above, the temperature coefficients of frequencies are small in the second comparative example because the piezoelectric film 14 has a temperature coefficient of elastic constant opposite in sign to that of the insulating film 28. As described above, the temperature dependences of the resonance frequency and anti-resonance frequency can be reduced by sandwiching the insulating film 28 between the piezoelectric films 14a and 14b.

Figure 9:
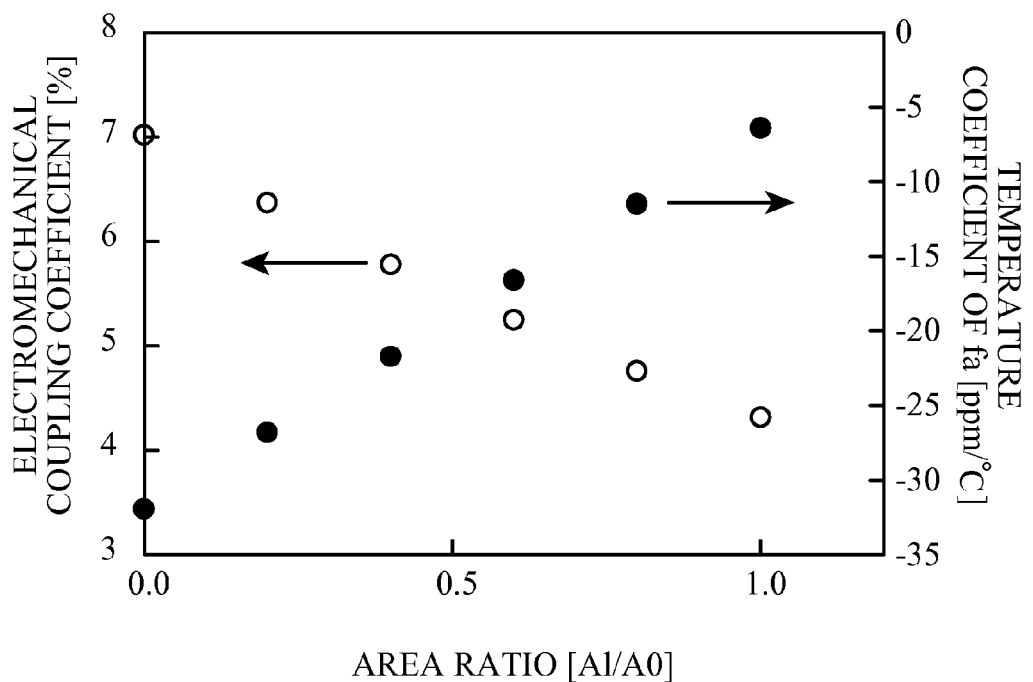
FIG. 9 is a graph of electromechanical coupling coefficient and temperature coefficient of anti-resonance frequency versus area ratio.

The electromechanical coupling coefficient and temperature coefficient are simulated by varying the area ratio A1/A0 from 0 to 1 in the first embodiment. The film thicknesses and materials of the films are the same as those of the exemplary piezoelectric thin film resonator having a resonance frequency of 2 GHz described in FIG. 1A and FIG. 1B. The resonance region 50 has an ellipsoidal shape with a major axis of 175 µm and a minor axis of 110 µm. FIG. 9 is a graph of electromechanical coupling coefficient and temperature coefficient of anti-resonance frequency versus area ratio. A case of the area ratio A1/A0=0 corresponds to the first comparative example. A case of the area ratio A1/A0=1 corresponds to the second comparative example. Open circles indicate the electromechanical coupling coefficient, and black circles indicate the temperature coefficient. As illustrated in FIG. 9, the electromechanical coupling coefficient and the temperature coefficient of frequency can be changed by varying the area ratio A1/A0 form 0 to 1.

The first embodiment makes the area of the insulating film 28 within the resonance region 50 different from that of the resonance region 50. This enables to set the area ratio A1/A0 arbitrarily as illustrated in FIG. 9. Therefore, the first embodiment enables to fabricate the piezoelectric thin film resonator having a desired temperature coefficient and a desired electromechanical coupling coefficient. For example, forming the insulating films 28 of different shapes suffices to fabricate the piezoelectric thin film resonators having different temperature coefficients and electromechanical coupling coefficients. Therefore, the piezoelectric thin film resonators having arbitrary temperature coefficients and electromechanical coupling coefficients can be formed on the single chip without the increase in the number of fabrication steps. As described above, the temperature characteristics and the resonance characteristics can be changed with respect to each of the resonators.

When the insulating film 28 is formed so as to contact the lower electrode 12 or the upper electrode 16, it improves the temperature coefficient, but the improvement is small. Therefore, when the insulating film 28 is formed so as to contact the lower electrode 12 or the upper electrode 16, this thicken the insulating film 28 and degrades the resonance characteristics. Thus, the insulating film 28 is preferably sandwiched by the piezoelectric film 14.

The insulating film 28 preferably has a temperature coefficient of elastic constant opposite in sign to that of the piezoelectric film 14. When the area ratio A1/A0 is close to 1, the temperature coefficient of frequency can come close to 0. Even when the temperature coefficient of the insulating film 28 has the same sign as that of the piezoelectric film 14, the temperature characteristics and the resonance characteristics can be changed with respect to each of the resonators.

Furthermore, it is sufficient if the piezoelectric film 14 is at least two piezoelectric films and the insulating film 28 is sandwiched between the at least two piezoelectric films 14. As described in the first embodiment, the piezoelectric thin film resonator can be fabricated with a small number of fabrication steps when the piezoelectric film is two piezoelectric films and the insulating film 28 is a single insulating film.

The pattern of the insulating film 28 or the pattern of the apertures 29 preferably has uniformity in the resonance region 50. Therefore, the pattern of the insulating film 28 or the apertures 29 within the resonance region 50 preferably has the dots arranged regularly or periodically as illustrated in FIG. 3A through FIG. 6D. The area ratio A1/A0 can be changed by increasing or decreasing sizes of the dots of the dot pattern illustrated in FIG. 3A through FIG. 6D uniformly. In addition, a width of the line pattern may be constant when the sizes of the dots of the dot pattern are changed uniformly.

Figure 10A:
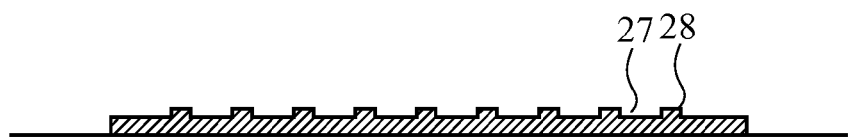
FIG. 10A and FIG. 10B are cross-sectional views of an insulating film in a first variation of the first embodiment.
Figure 10B:
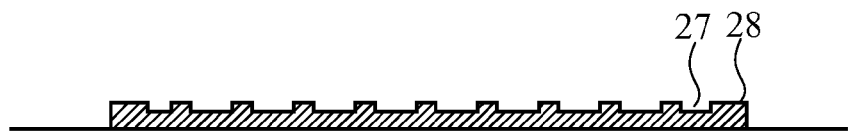

A description will be given of variations of the first embodiment. FIG. 10A and FIG. 10B are cross-sectional views of an insulating film in a first variation of the first embodiment. FIG. 10A is a cross-sectional view taken along line A-A in FIG. 3A, and FIG. 10B is a cross-sectional view taken along line A-A in FIG. 4A. As illustrated in FIG. 10A and FIG. 10B, the insulating film 28 may have a concave portion 27 instead of the aperture 29. The area other than the concave portion 27 forms a convex portion. As described above, even when the convex portion and the concave portion are formed in the insulating film 28, the volume of the insulating film 28 within the resonance region 50 can be changed by changing an area ratio of an area of the concave portion 27 within the resonance region 50 to the area of the resonance region 50. Therefore, the first variation of the first embodiment can change the temperature characteristics and the resonance characteristics with respect to each of the resonators as well as the first embodiment. A planner shape of the concave portion 27 may be the same as that of the dot illustrated in FIG. 3A through FIG. 6D.

Figure 11A:
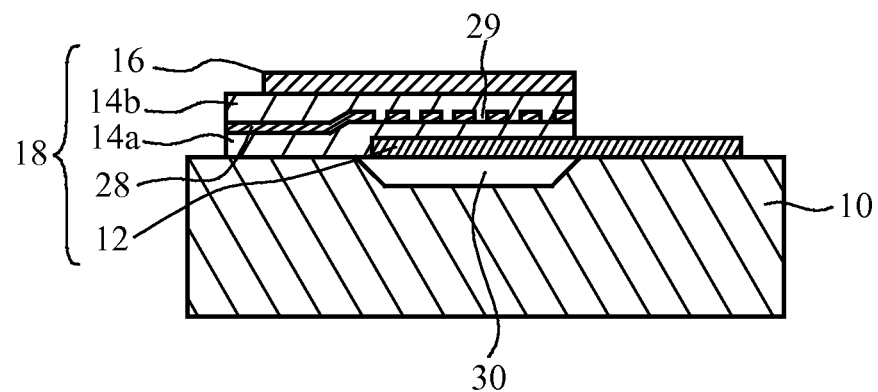
FIG. 11A and FIG. 11B are cross-sectional views of piezoelectric thin film resonators in accordance with second and third variations of the first embodiment respectively.
Figure 11B:
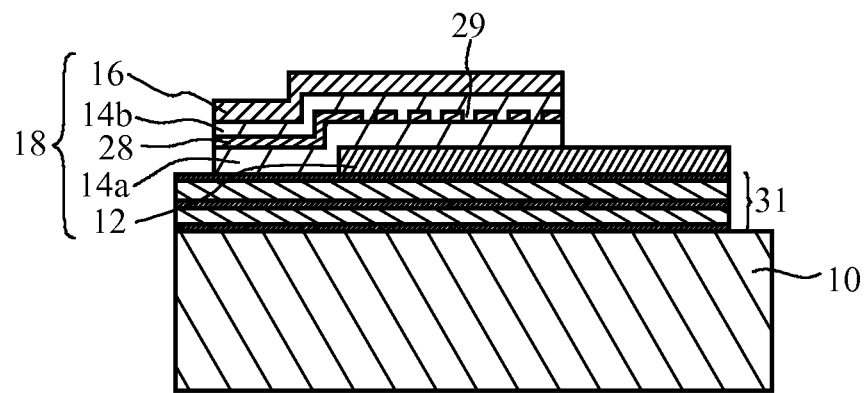

FIG. 11A and FIG. 11B are cross-sectional views of piezoelectric thin film resonators in accordance with second and third variations of the first embodiment respectively. As illustrated in FIG. 11A, a recessed portion may be formed on an upper surface of the substrate 10 to form the space 30. Furthermore, the space 30 may be a penetration hole piercing through the substrate. As illustrated in FIG. 11B, an acoustic reflection film 31 may be used instead of the space 30. The acoustic reflection film 31 may be a film formed by stacking a film having a high acoustic impedance and a film having a low acoustic impedance alternately with a film thickness of a quarter of the wavelength of the acoustic wave. This allows the acoustic reflection film 31 to reflect a longitudinal acoustic wave.

Second Embodiment

Figure 12A:
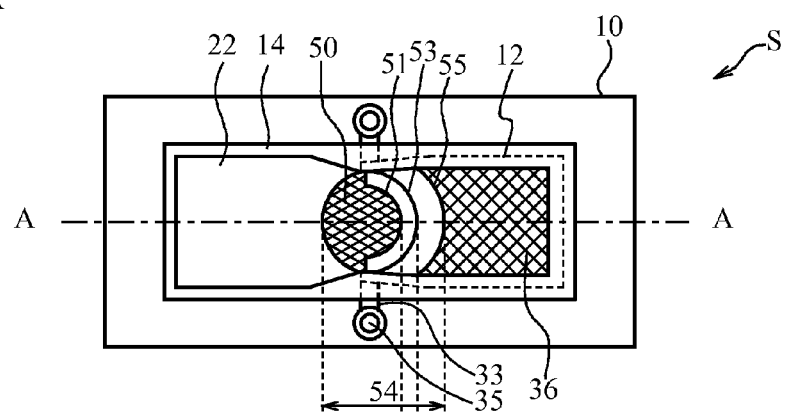
FIG. 12A is a plain view of a piezoelectric thin film resonator in accordance with a second embodiment.
Figure 12B:
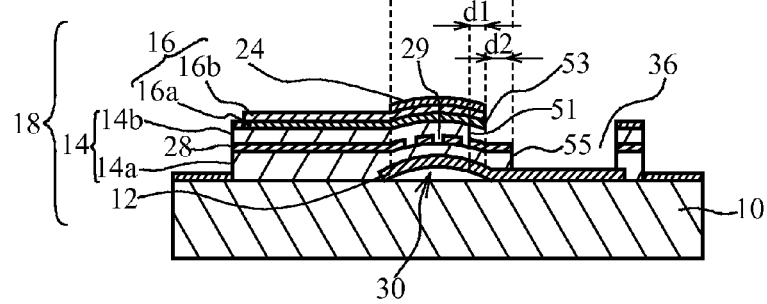
FIG. 12B and FIG. 12C are cross-sectional views taken along line A-A in FIG. 12A.
Figure 12C:
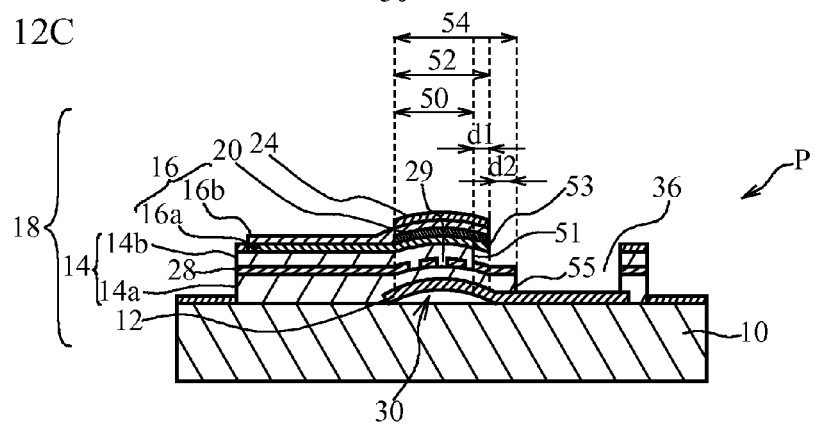

FIG. 12A is a plain view of a piezoelectric thin film resonator in accordance with a second embodiment, and FIG. 12B and FIG. 12C are cross-sectional views taken along line A-A in FIG. 12A. FIG. 12B is a cross-sectional view of a series resonator in, for example, a ladder-type filter, and FIG. 12C is a cross-sectional view of a parallel resonator in the ladder-type filter. As illustrated in FIG. 12A through FIG. 12C, an outer periphery 51 of the piezoelectric film 14b in a region 52, in which the lower electrode 12 and the upper electrode 16 face each other, is located in a region further in than an outer periphery 53 of the upper electrode 16 by a distance d1 in at least a part of the outer periphery of the resonance region 50. Moreover, an outer periphery 55 of the piezoelectric film 14a is located further out than the outer periphery 53 by a distance d2 in a region in which the outer periphery 51 of the piezoelectric film 14b is formed further in than the outer periphery 53 of the upper electrode 16. The outer periphery of the insulating film 28 is positioned to substantially correspond to the outer periphery 55 of the piezoelectric film 14a. The resonance region 50, in which the upper electrode 16 and the lower electrode 12 face each other across the piezoelectric film 14, is smaller than the region 52 by the distance d1. A region 54, in which the piezoelectric film 14a and the lower electrode 12 overlap each other, is larger than the region 52 by the distance d2. Other structures are the same as those of the first embodiment illustrated in FIG. 1A through FIG. 1C, and a description is omitted.

The outer periphery 51 of the piezoelectric film 14b in the region 52 is located further in than the outer periphery 53 of the upper electrode 16 in the second embodiment. This enables to prevent the acoustic wave within the piezoelectric film 14b from leaking to the outside of the resonance region 50. Therefore, the resonance characteristics can be improved. It is sufficient if the outer periphery 51 of the piezoelectric film 14b, which is an uppermost layer of the at least two piezoelectric films 14a and 14b in the region 52, is located further in than the outer periphery 53 of the upper electrode 16 when at least two piezoelectric films are formed.

The outer periphery 55 of the piezoelectric film 14a is located further out than the outer periphery 53 of the upper electrode 16 in a region of the outer periphery 53 of the upper electrode 16 in which the outer periphery 51 of the piezoelectric film 14b is formed further in than the outer periphery 53 of the upper electrode 16. This ensures the strength of the multilayered film 18 compared to locating the outer periphery 55 of the piezoelectric film 14a further in than the outer periphery 53 of the upper electrode 16. It is sufficient if an outer periphery of the piezoelectric film 14a, which is a lowermost layer of the at least two piezoelectric films 14a and 14b, is located further out than the outer periphery 53 of the upper electrode 16 when at least two piezoelectric films are formed.

An outer periphery of the space 30 is preferably located further out than the outer periphery 53 of the upper electrode 16. When the acoustic reflection film 31 is used instead of the space 30 as described in the third variation of the first embodiment, an outer periphery of the acoustic reflection film 31 is preferably located further out than the outer periphery 53 of the upper electrode 16.

When the space 30 is located below the lower electrode 12, the outer periphery of the space 30 is preferably located further out than the outer periphery 53 of the upper electrode 16 and further in than the outer periphery 55 of the piezoelectric film 14a in a region in which the outer periphery 51 of the piezoelectric film 14b is formed further in than the outer periphery 53 of the upper electrode 16. As described above, the resonance characteristics can be improved by locating the outer periphery 51 further in than the outer periphery 53. Furthermore, when the space 30 is formed, the strength of the multilayered film 18 tends to be small, but the strength of the multilayered film 18 can be enhanced by locating the outer periphery 55 further out than the outer periphery of the space 30.

The outer periphery 55 of the piezoelectric film 14a is positioned to substantially correspond to the outer periphery of the insulating film 28 in the second embodiment, but the outer periphery of the insulating film 28 may be positioned to substantially correspond to the outer periphery 51 of the piezoelectric film 14b. In addition, the outer periphery of the insulating film 28 may be positioned between the outer periphery 51 of the piezoelectric film 14b and the outer periphery 55 of the piezoelectric film 14a.

In the second embodiment, edge portions of the outer peripheries 55 and 51 of the piezoelectric films 14a and 14b are parallel in the film thickness directions of the piezoelectric films 14a and 14b, but the edge portions of the outer peripheries 55 and 51 may be tilted in the film thickness directions of the piezoelectric films 14a and 14b. In this case, it is sufficient if the innermost of the edge portion of the outer periphery 51 of the piezoelectric film 14b is located further in than the edge portion of the outer periphery 53 of the upper electrode 16. Especially, a position, at which the edge portion of the outer periphery 51 of the piezoelectric film 14b contact the upper electrode 16, is preferably located further in than the edge portion of the outer periphery 53 of the upper electrode 16.

Third Embodiment

Figure 13A:
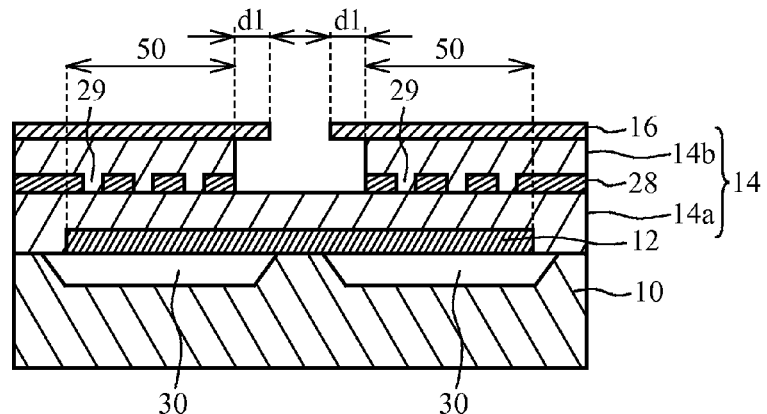
FIG. 13A through FIG. 13C are cross-sectional views of piezoelectric thin film resonators in accordance with a third embodiment.
Figure 13B:
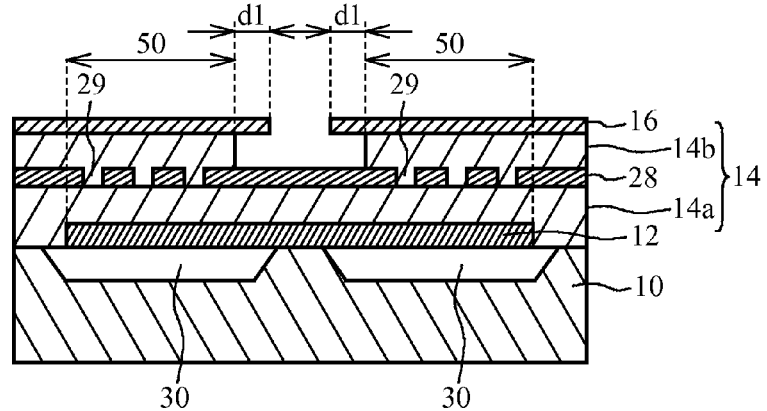
Figure 13C:
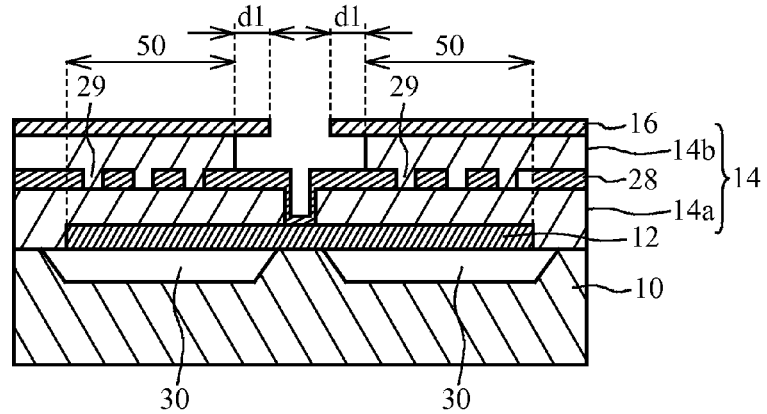

A third embodiment forms piezoelectric thin film resonators on a substrate like a filter. FIG. 13A through FIG. 13C are cross-sectional views of piezoelectric thin film resonators in accordance with the third embodiment. Two resonators are formed on the substrate 10 in FIG. 13A through FIG. 13C. Recessed portions are formed in the substrate 10 to function as the spaces 30. The lower electrode 12, the piezoelectric film 14a, the insulating film 28, the piezoelectric film 14b and the upper electrode 16 are formed on the substrate 10 through the spaces 30. Formed are two resonance regions 50, in each of which the upper electrode 16 and the lower electrode 12 face each other across the piezoelectric film 14.

In FIG. 13A, the piezoelectric film 14a is continuously formed between the resonance regions 50, and the insulating film 28 is not formed between the resonance regions 50. In FIG. 13B, the piezoelectric film 14a and the insulating film 28 are continuously formed between the resonance regions 50. In FIG. 13C, the piezoelectric film 14a is not continuously formed between the resonance regions 50, and the insulating film 28 is continuously formed between the resonance regions 50.

As described in the third embodiment, when the resonators are formed on the substrate 10, the lower electrodes 12 of the resonators may be interconnected, and the piezoelectric films 14a (lowermost piezoelectric films) may be interconnected on the interconnected lower electrodes 12 or/and the insulating films 28 (insulating films located on the lowermost piezoelectric films) may be interconnected on the interconnected lower electrodes 12. This enables to form the resonators close to each other, and to achieve the reduction in size of the chip. The lower electrode 12 and at least one of the piezoelectric film 14a and the insulating film 28 are formed in the outer periphery of the space 30, and this enhances the strength of the multilayered film 18.

The insulating films 28 are preferably formed on the interconnected lower electrodes 12 so as to be connected to each other. This improves the resistance to electrostatic discharge failure.

Fourth Embodiment

Figure 14:
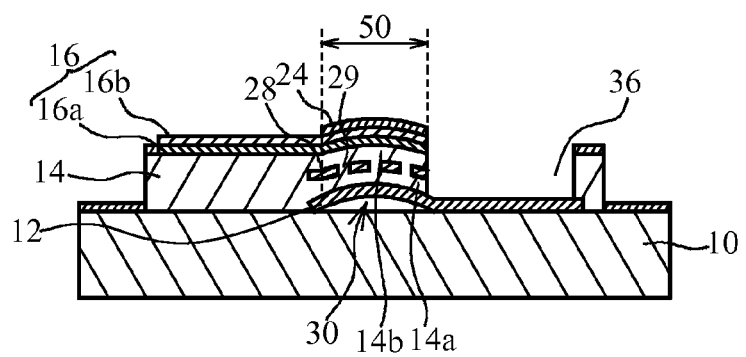
FIG. 14 is a cross-sectional view of a piezoelectric thin film resonator in accordance with a fourth embodiment.

FIG. 14 is a cross-sectional view of a piezoelectric thin film resonator in accordance with a fourth embodiment. As illustrated in FIG. 14, the insulating film 28 is not formed between the upper electrode 16 and the substrate 10 in at least a part of a region in which the upper electrode 16 is formed and the lower electrode 12 is not formed. Other structures are the same as those of the first embodiment, and a description is omitted. When a bump is formed on the upper electrode 16 in a region in which the insulating film 28 is not formed, and a flip-chip bonding is performed, or when a bonding wire is connected, exfoliation of the insulating film 28 and the piezoelectric film 14 can be suppressed.

Fifth Embodiment

Figure 15A:
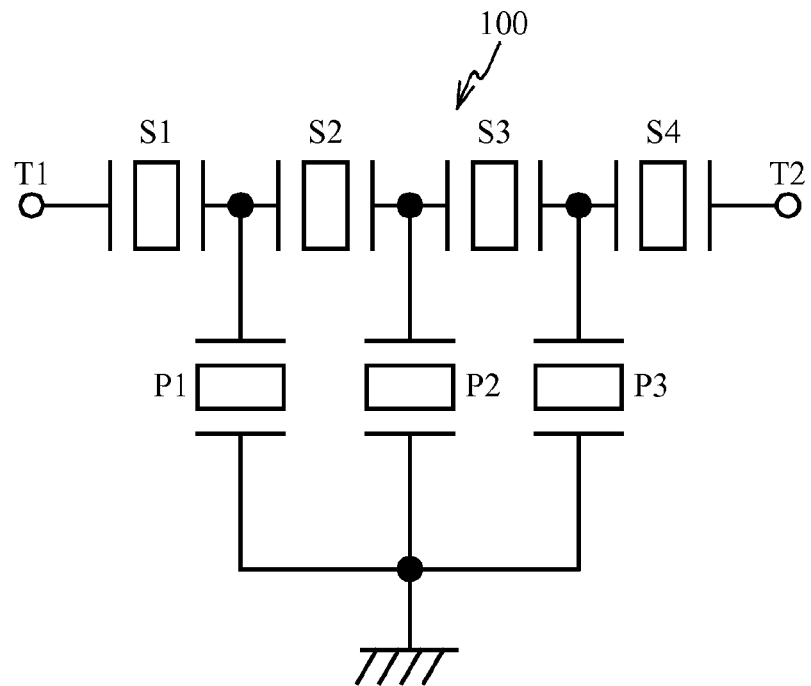
FIG. 15A and FIG. 15B are circuit diagrams illustrating a filter in accordance with a fifth embodiment.
Figure 15B:
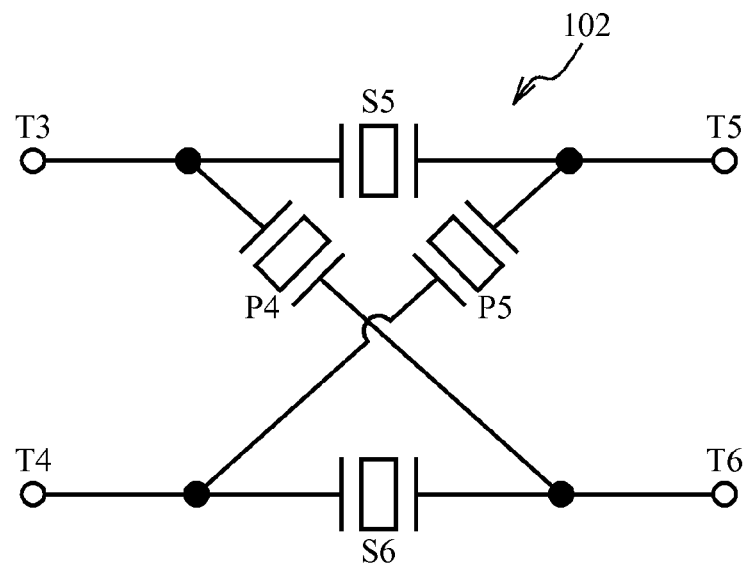

A fifth embodiment uses the resonators of the first through fourth embodiments for a filter as an acoustic wave device. FIG. 15A and FIG. 15B are circuit diagrams illustrating filters in accordance with the fifth embodiment. FIG. 15A illustrates a ladder-type filter, and FIG. 15B illustrates a lattice-type filter. As illustrated in FIG. 15A, a ladder-type filter 100 includes series resonators S1 through S4 and parallel resonators P1 through P3. The series resonators S1 through S4 are connected in series between an input terminal T1 and an output terminal T2. The parallel resonators P1 through P3 are connected in parallel between the input terminal T1 and the output terminal T2.

As illustrated in FIG. 11B, a lattice-type filter 102 includes series resonators S5 and S6 and parallel resonators P4 and P5. The series resonator S5 is connected between terminals T3 and T5, and the series resonator S6 is connected between terminals T4 and T6. The parallel resonator P4 is connected between the terminals T3 and T6, and the parallel resonator P5 is connected between the terminals T4 and T5.

The resonators of the first through fourth embodiments can be used for at least one of the resonators in the filters of the fifth embodiment.

As described in the fifth embodiment, when the acoustic wave device includes piezoelectric thin film resonators, at least two piezoelectric thin film resonators can be made to have different area ratios A1/A0 of the area of the insulating film 28 within the resonance region 50 to the area of the resonance region 50. Or, at least two piezoelectric thin film resonators can be made to have different area ratios A1/A0 of the area of the concave portion 27 within the resonance region 50 to the area of the resonance region 50. This enables to form piezoelectric thin film resonators having arbitrary temperature coefficients and electromechanical coupling coefficients on a single chip.

The ladder-type filter and the lattice-type filter function as a bandpass filter. Parallel resonators mainly form a skirt characteristic at a low frequency side of the passband, while series resonators mainly form a skirt characteristic at a high frequency side of the passband. Therefore, at least one of the series resonators is made to have an area ratio A1/A0 different from that of at least one of the parallel resonators. This allows the series resonator to have a temperature coefficient and an electromechanical coupling coefficient different from those of the parallel resonator. Therefore, the skirt characteristics at low and high frequency sides can be set to desired characteristics. When all the series resonators are made to have area ratios A1/A0 different from those of all the parallel resonators, the series resonators can have temperature coefficients and electromechanical coupling coefficients different from those of the parallel resonators. For example, the series resonators may have area ratios equal to each other, the parallel resonators may have area ratios equal to each other, and the series resonators may have area ratios different from those of the parallel resonators.

A description will now be given of an exemplary duplexer in which a first filter is connected between a common terminal and a first terminal, and a second filter is connected between the common terminal and a second terminal. A passband of the first filter does not overlap with and is adjacent to a passband of the second filter in this duplexer. The frequency change due to temperature is preferably small in the series resonator or/and the parallel resonator forming a skirt characteristic at a side of a guard band between the passbands of the first filter and the second filter (hereinafter, also referred to as a guard band side) in this duplexer. On the other hand, the electromechanical coupling coefficient is preferably high in the series resonator or/and the parallel resonator forming a skirt characteristic at a side opposite to the guard band side in order to widen the passband. Therefore, the area ratio A1/A0 in the resonator forming the skirt characteristic at the guard band side is made to be higher than that of the resonator forming the skirt characteristic at the side opposite to the guard band side. This enables to lessen the change in the skirt characteristic at the guard band side due to temperature, and to widen the passband.

Furthermore, at least one of the series resonators may have an area ratio different from that of another of the series resonators, or/and at least one of the parallel resonators may have an area ratio different from that of another of the parallel resonators. This enables to make the skirt characteristic at a low frequency side or/and a high frequency side have a desired characteristic. The series resonators may have area ratios different from each other, or/and the parallel resonators may have area ratios different from each other. This enables to make the skirt characteristic at a low frequency side or/and a high frequency side have a desired characteristic.

Sixth Embodiment

Figure 16A:
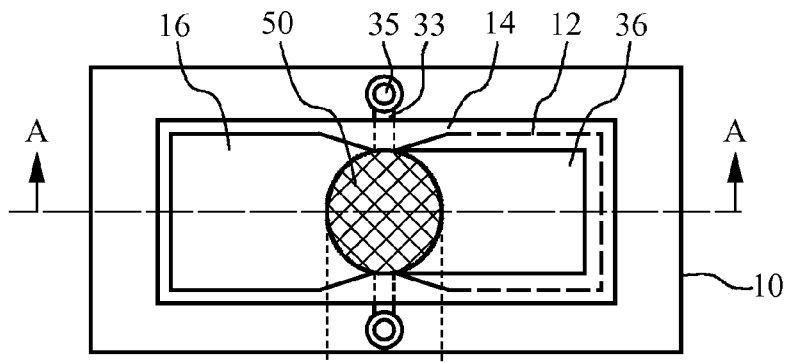
FIG. 16A is a plain view of a piezoelectric thin film resonator in accordance with a sixth embodiment.
Figure 16B:
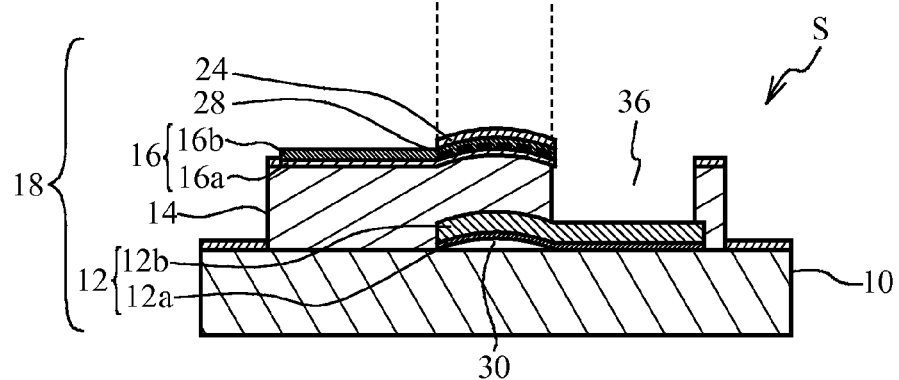
FIG. 16B and FIG. 16C are cross-sectional views taken along line A-A in FIG. 16A.
Figure 16C:
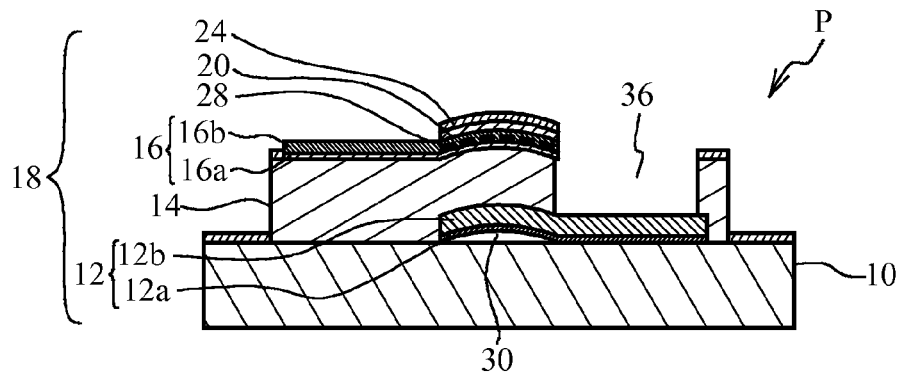

A sixth embodiment is an exemplary resonator used in an acoustic wave device. FIG. 16A is a plain view of a piezoelectric thin film resonator in accordance with the sixth embodiment, and FIG. 16B and FIG. 16C are cross-sectional views taken along line A-A in FIG. 16A. FIG. 16B is a cross-sectional view of a series resonator in a ladder-type filter, and FIG. 16C is a cross-sectional view of a parallel resonator in the ladder-type filter.

Referring to FIG. 16A and FIG. 16B, a description will be given of a structure of the series resonator S. The lower electrode 12 is located on the substrate 10, which is a silicon (Si) substrate, so that the dome-shaped space 30, which bulges out toward the lower electrode 12, is formed between the flat principal surface of the substrate 10 and the lower electrode 12. The dome-shaped space 30 has a height which is low near the peripheral portion of the space 30 and becomes higher as closer to the central portion of the space 30, for example. The lower electrode 12 includes the lower layer 12a and the upper layer 12b. The lower layer 12a is a Cr (chrome) film for example, and the upper layer 12b is an Ru (ruthenium) film for example.

Located on the lower electrode 12 is the piezoelectric film 14 mainly including aluminum nitride (AlN) having a main direction of (002) direction. The upper electrode 16 is located on the piezoelectric film 14 so as to have a region (resonance region 50) in which the upper electrode 16 faces the lower electrode 12 across the piezoelectric film 14. The resonance region 50 has an ellipsoidal shape, and is a region in which the acoustic wave in a thickness longitudinal oscillation mode resonates. The upper electrode 16 includes the lower layer 16a and the upper layer 16b. The lower layer 16a and the upper layer 16b are Ru films for example. The temperature compensation film 28 is located between the lower layer 16a and the upper layer 16b. The temperature compensation film 28 is a film mainly including silicon oxide. Silicon oxide has a positive temperature coefficient of elastic constant. The area of the temperature compensation film 28 within the resonance region 50 is different from that of the resonance region 50. For example, the temperature compensation film 28 within the resonance region 50 is patterned so as to have an area smaller than that of the resonance region 50.

A silicon oxide film is formed on the upper electrode 16 as the frequency adjusting film 24. The multilayered film 18 within the resonance region 50 includes the lower electrode 12, the piezoelectric film 14, the upper electrode 16, the temperature compensation film 28, and the frequency adjusting film 24. The frequency adjusting film 24 may function as a passivation film.

As illustrated in FIG. 16A, the introduction path 33 for etching the sacrifice layer is formed in the lower electrode 12. The sacrifice layer is a layer for forming the space 30. The end portion of the introduction path 33 is not covered with the piezoelectric film 14, and the lower electrode 12 has the hole portion 35 at the end of the introduction path 33. As illustrated in FIG. 16A and FIG. 16B, the aperture 36 is formed in the piezoelectric film 14 to provide the electrical connection with the lower electrode 12. A base film for a bump such as Au may be located on the lower electrode 12 located at the bottom of the aperture 36 to provide an external connection.

A description will be given of a structure of the parallel resonator P with reference to FIG. 16A and FIG. 16C. Compared to the series resonator S, the parallel resonator P includes the mass load film 20 made of a Ti (titanium) layer between the upper electrode 16 and the frequency adjusting film 24. Thus, the multilayered film 18 includes the mass load film 20 formed over the entire surface in the resonance region 50 in addition to the multilayered film of the series resonator S. Other structures are the same as those of the series resonator S illustrated in FIG. 16B, and a description is omitted.

The film thickness of the mass load film 20 is used to adjust a difference in resonance frequency between the series resonator S and the parallel resonator P. The film thickness of the frequency adjusting film 24 is used to adjust resonance frequencies of the series resonator S and the parallel resonator P. Adjustment of the difference in resonance frequency between the series resonator S and the parallel resonator P is possible by making the area ratio, which is a ratio of the area of the temperature compensation film 28 to the area of the resonance region 50 in the series resonator S, different from that in the parallel resonator P without using the mass load film 20. For example, the area of the temperature compensation film 28 within the resonance region 50 in the parallel resonator may be made larger than the area of the temperature compensation film 28 within the resonance region 50 in the series resonator.

In FIG. 16B and FIG. 16C, the outer periphery of the piezoelectric film 14 at the aperture 36 side is located further in than the upper electrode 16. This prevents the acoustic wave within the piezoelectric film 14 from leaking to the outside of the resonance region 50. The outer periphery of the piezoelectric film 14 may be positioned to correspond to the upper electrode 16, or further out than the upper electrode 16.

The substrate 10 may be a quartz substrate, a glass substrate, a ceramic substrate, or a GaAs substrate besides the Si substrate. The lower electrode 12 and the upper electrode 16 may be a single layer film made of Al (aluminum), Ti (titanium), Cu (copper), Mo (molybdenum), W (tungsten), Ta (tantalum), Pt (platinum), Rh (rhodium), or Ir (iridium), or a multilayered film of these materials besides Ru and Cr. When the upper electrode 16 is a multilayered film, the temperature compensation film 28 may be located on a boundary face of the multilayered film. For example, the lower layer 16a of the upper electrode 16 may be made of Ru, and the upper layer 16b may be made of Mo. The piezoelectric film 14 may be made of ZnO (zinc oxide), PZT (lead zirconate titanate), or PbTiO$_3$ (lead titanate) besides aluminum nitride. The piezoelectric film 14 may mainly include aluminum nitride, and additionally include another element to improve the resonance characteristics or the piezoelectricity. For example, the addition of Sc (scandium) improves the piezoelectricity of the piezoelectric film 14, and thus improves the effective electromechanical coupling coefficient of the piezoelectric thin film resonator.

The temperature compensation film 28 has a temperature coefficient of elastic constant opposite in sign to that of the piezoelectric film 14. This enables to make the temperature coefficient of frequency close to 0. The piezoelectric film 14 made of aluminum nitride has a negative temperature coefficient of elastic constant. Therefore, the temperature compensation film 28 is made of a material having a positive temperature coefficient of elastic constant. For example, a silicon oxide film or a silicon nitride film has a positive temperature coefficient of elastic constant. The silicon oxide film or silicon nitride film may not have a stoichiometric composition.

In addition, the temperature compensation film 28 may mainly include a silicon oxide film or a silicon nitride film, and additionally include another element to improve the resonance characteristics or the temperature characteristics. For example, the temperature compensation film 28 may mainly include the silicon oxide film, and additionally include one of F (fluorine), H (hydrogen), $CH_3$, $CH_2$, Cl (chlorine), C (carbon), N (nitrogen), P (phosphorus), and S (sulfur). This enables to make the temperature coefficient of elastic constant of the silicon oxide film high. Thus, the film thickness of the temperature compensation film 28 can be made small. This improves patterning accuracy of the temperature compensation film 28. When the piezoelectric film 14 is formed on the temperature compensation film 28 as described in seventh and eighth embodiments, degradation in orientation of the piezoelectric film 14 is suppressed by making the temperature compensation film 28 thin.

A silicon nitride film or an aluminum nitride film may be used for the frequency adjusting film 24 besides the silicon oxide film. The mass load film 20 may be a single layer film made of Ru, Cr, Al, Cu, Mo, W, Ta, Pt, Rh, or Ir besides Ti. The mass load film 20 may be an insulating film made of metal nitride such as silicon nitride or metal oxide such as silicon oxide. The mass load film 20 may be formed below the lower electrode 12, between the layers of the lower electrode 12, on the upper electrode 16, between the lower electrode 12 and the piezoelectric film 14, or between the piezoelectric film 14 and the upper electrode 16 besides between the layers of the upper electrode 16. The mass load film 20 may be larger than the resonance region 50 as long as formed so as to include the resonance region 50.

Figure 17A:
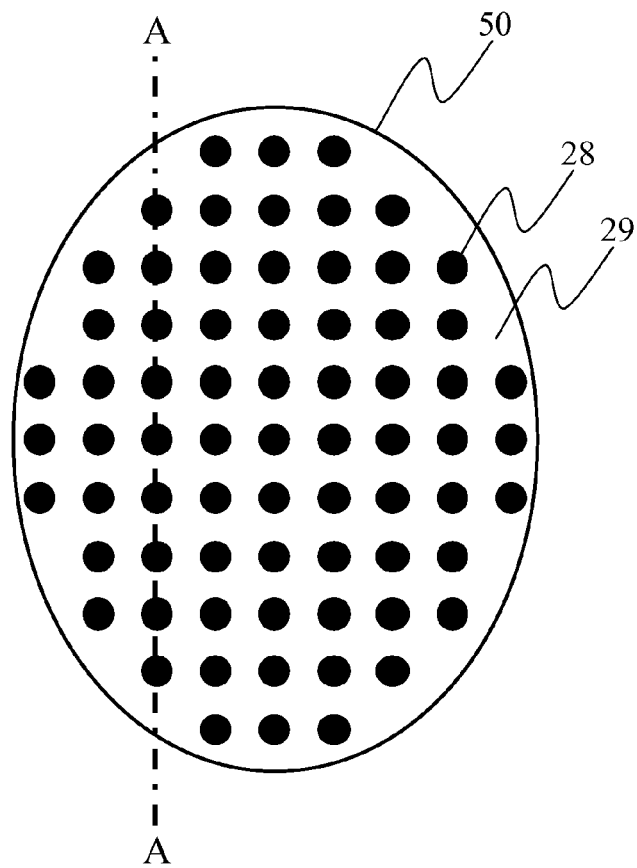
FIG. 17A is a plain view of an exemplary temperature compensation film.
Figure 17B:
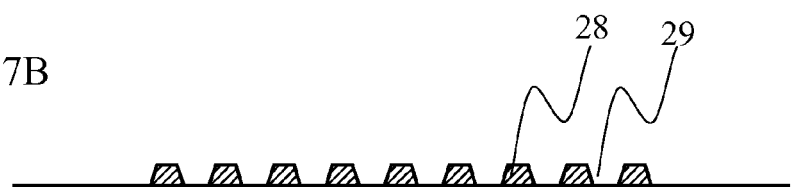
FIG. 17B is a cross-sectional view taken along line A-A in FIG. 17A.

A description will now be given of a shape of the temperature compensation film 28. FIG. 17A is a plain view of an exemplary temperature compensation film, and FIG. 17B is a cross-sectional view taken along line A-A in FIG. 17A. As illustrated in FIG. 17A and FIG. 17B, the temperature compensation film 28 is formed to be island-shaped in the resonance region 50. The aperture 29 is the region in which the temperature compensation film 28 is not formed. The island-shaped temperature compensation film 28 forms a dot pattern having circular dots arranged regularly or periodically.

Figure 18A:
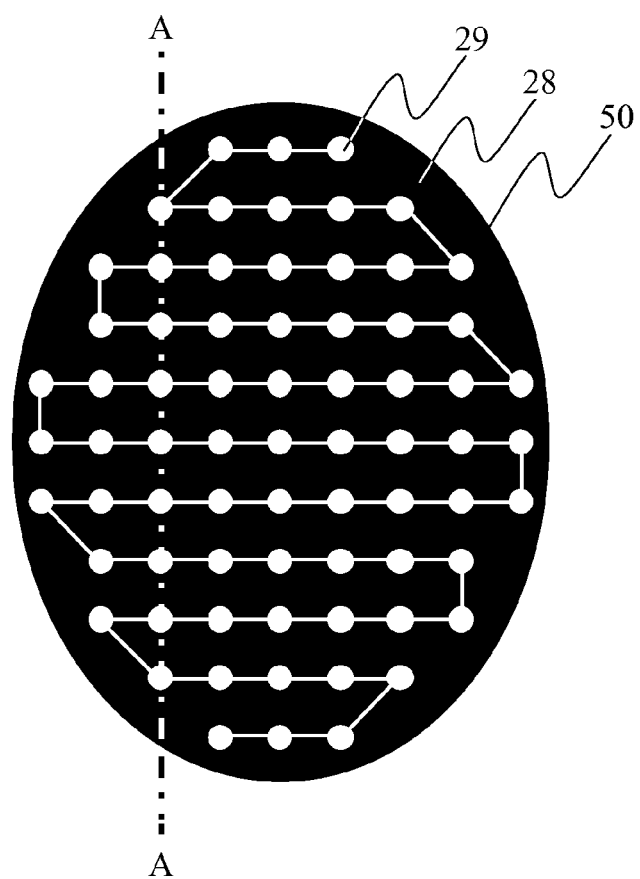
FIG. 18A is a plain view of another exemplary temperature compensation film.
Figure 18B:
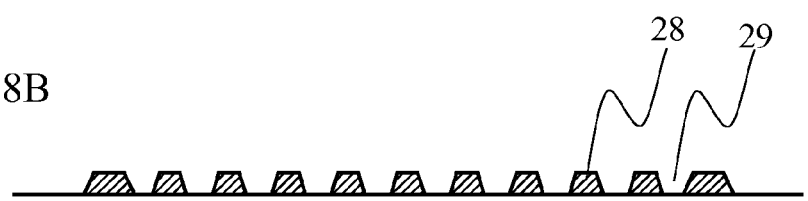
FIG. 18B is a cross-sectional view taken along line A-A in FIG. 18A.

FIG. 18A is a plain view of another exemplary temperature compensation film, and FIG. 18B is a cross-sectional view taken along line A-A in FIG. 18A. As illustrated in FIG. 18A and FIG. 18B, the temperature compensation film 28 is formed to have the apertures 29 in the resonance region 50. The apertures 29 form a dot pattern having circular dots arranged regularly or periodically. The dots of the dot pattern are interlinked by a line pattern. The line pattern is formed in a zig-zag manner.

As illustrated in FIG. 17B and FIG. 18B, the temperature compensation film 28 has a tapered side surface so as to have an upper surface with a width smaller than that of a lower surface. Located in the upper electrode 16, the temperature compensation film 28 can reduce an unnecessary space in the upper electrode 16 by having the tapered side surface. The dots of the dot pattern illustrated in FIG. 17A and FIG. 18B have a circular shape, but may have other shapes such as polygon. The dot pattern may have an irregular arrangement or a random arrangement. The line pattern may have a shape other than that illustrated in FIG. 18A. The temperature compensation film 28 is preferably formed over the entire surface uniformly. For example, the temperature compensation film 28 is formed nearly uniformly in the resonance region 50.

In the resonance region 50, the island-shaped temperature compensation film 28 may be formed, or the temperature compensation film 28 having the apertures 29 may be formed.

The temperature compensation film 28 within the resonance region 50 has a shape different from that of the resonance region 50 in both cases. The area ratio A1/A0, which is a ratio of the area A1 of the temperature compensation film 28 within the resonance region 50 to the area A0 of the resonance region 50, is lower than 1 and higher than 0. The island-shaped temperature compensation film 28 is formed when the area ratio A1/A0 is made to be lower than or equal to a given value. The temperature compensation film 28 having the apertures is formed when the area ratio A1/A0 is made to be higher than or equal to the given value. For example, the island-shaped temperature compensation film 28 is formed when the area ratio A1/A0 is higher than 0 and lower than or equal to 0.5, and the temperature compensation film 28 having the apertures is formed when the area ratio A1/A0 is higher than and equal to 0.5 and lower than 1.

The temperature coefficient of frequency is shifted to a positive side with the increase in the area ratio A1/A0. The resonance frequency and the effective electromechanical coupling coefficient become low. Therefore, varying the area ratio A1/A0 enables to control characteristics: a temperature coefficient of frequency, a resonance frequency, and an effective electromechanical coupling coefficient. Change of the exposure mask easily enables resonators to have different area ratios A1/A0 in the acoustic wave device.

Figure 19A:
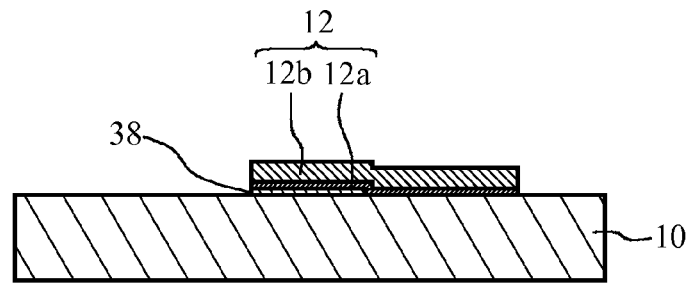
FIG. 19A through FIG. 19C are cross-sectional views illustrating a fabrication method of a parallel resonator in accordance with a sixth embodiment.

FIG. 19A through FIG. 20B are cross-sectional views illustrating a fabrication method of the parallel resonator P in accordance with the sixth embodiment. As illustrated in FIG. 19A, formed is the sacrifice layer 38 for forming a space above the substrate 10 having the flat principal surface. The sacrifice layer 38 has a film thickness of 10 to 100 nm for example, and is made of a material, such as MgO, ZnO, Ge, or $SiO_2$, that is easily dissolved in an etching liquid or an etching gas. The sacrifice layer 38 is then patterned into a desired shape by photolithography and etching. The sacrifice layer 38 has a shape corresponding to a planar shape of the space 30, and includes a region to become the resonance region 50 for example. In the next step, the lower layer 12a and the upper layer 12b are formed on the sacrifice layer 38 and the substrate 10 as the lower electrode 12. The sacrifice layer 38 and the lower electrode 12 are formed by sputtering, vacuum evaporation, or CVD, for example. The lower electrode 12 is then patterned into a desired shape by photolithography and etching. The lower electrode 12 may be formed by liftoff.

Figure 19B:
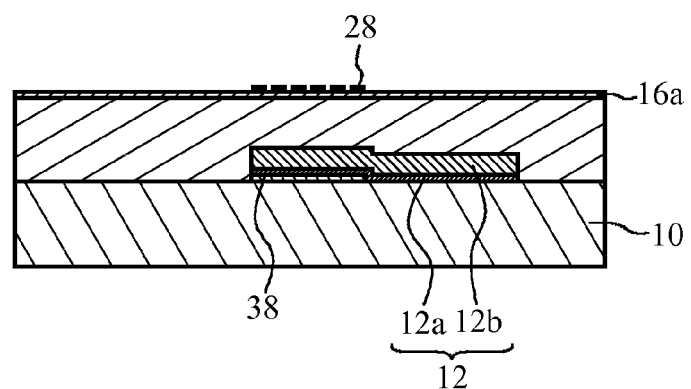

As illustrated in FIG. 19B, the piezoelectric film 14, the lower layer 16a of the upper electrode 16, and the temperature compensation film 28 are formed on the lower electrode 12 and the substrate 10 by sputtering, vacuum evaporation, or CVD, for example. The temperature compensation film 28 is patterned into a desired shape by photolithography and etching. At this point, the side surface of the temperature compensation film 28 is tapered so that the temperature compensation film 28 has the upper surface with a width smaller than that of the lower surface.

Figure 19C:
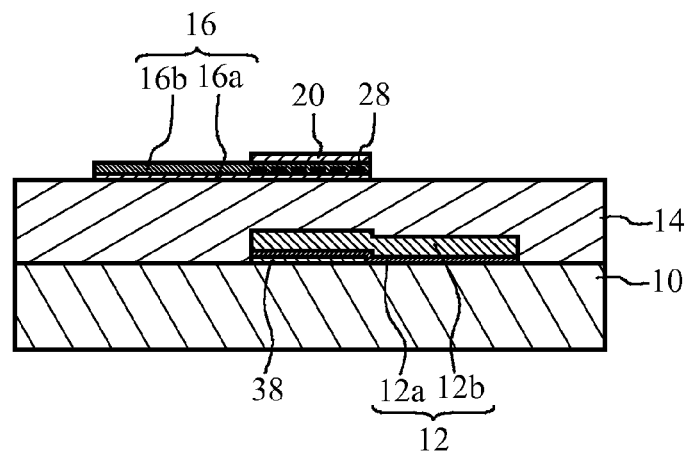

As illustrated in FIG. 19C, the upper layer 16b of the upper electrode 16, and the mass load film 20 are formed by sputtering, vacuum evaporation, or CVD, for example. The mass load film 20 is patterned into a desired shape by photolithography and etching. The mass load film 20 is completely removed in the series resonator S. The upper electrode 16 is patterned into a desired shape by photolithography and etching.

Figure 20A:
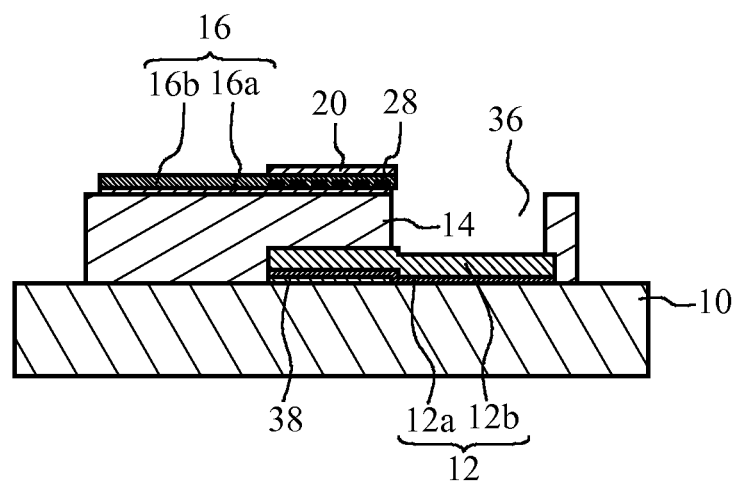
FIG. 20A and FIG. 20B are cross-sectional views illustrating the fabrication method of the parallel resonator in accordance with the sixth embodiment.

As illustrated in FIG. 20A, the piezoelectric film 14 is patterned into a desired shape by photolithography and etching. The piezoelectric film 14 is etched using a solution including, for example, phosphoric acid so that at least a part of the outer periphery of the piezoelectric film 14 is located further in than the outer periphery of the upper electrode 16. This enables to improve the resonance characteristics. A position of the outer periphery of the piezoelectric film 14 is controlled by changing etching time. The lower electrode 12 is exposed through the aperture 36. Therefore, a bump such as Au can be electrically connected to the lower electrode 12 through the aperture 36. This allows the lower electrode 12 to be electrically connected to an external circuit.

Figure 20B:
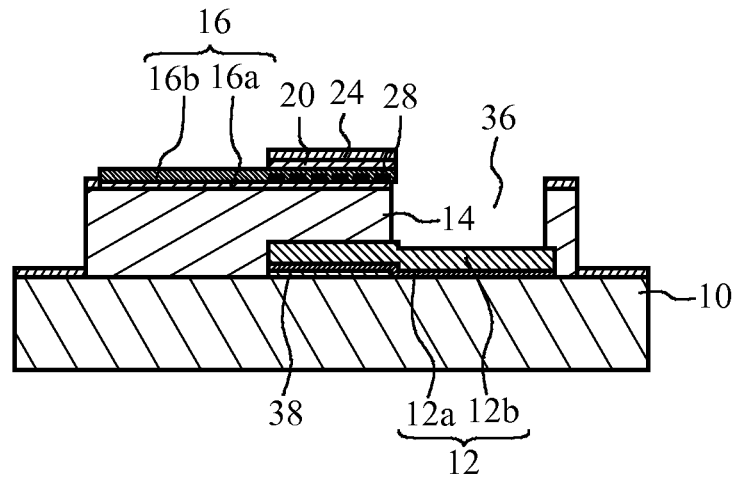

As illustrated in FIG. 20B, the frequency adjusting film 24 is formed by sputtering or CVD, for example. The frequency adjusting film 24 is patterned into a desired shape by photolithography and etching.

The etching liquid for the sacrifice layer 38 is then introduced into the sacrifice layer 38 below the lower electrode 12 through the hole portion 35 and the introduction path 33 (see FIG. 16A). This process removes the sacrifice layer 38. A medium for etching the sacrifice layer 38 is preferably a medium that does not etch materials constituting the resonator except the sacrifice layer 38. In particular, the etching medium is preferably a medium that does not etch the lower electrode 12 with which the etching medium contacts. The stress of the multilayered film 18 is set to be a compression stress. This makes the multilayered film 18 separate from the substrate 10 and bulge out toward an opposite side to the substrate 10 when the sacrifice layer 38 is removed. The dome-shaped space 30 is formed between the lower electrode 12 and the substrate 10. The above described process completes the series resonator S illustrated in FIG. 16A and FIG. 16B and the parallel resonator P illustrated in FIGS. 16A and 16C.

The temperature compensation film 28 has a temperature coefficient of elastic constant opposite in sign to that of the piezoelectric film 14 in the sixth embodiment. The upper electrodes 16 are formed on the upper surface and the lower surface of the temperature compensation film 28, and mutually short-circuited. This allows the temperature compensation film 28 to elastically contribute to the resonance characteristics, and to reduce the temperature coefficient of frequency. As the temperature compensation film 28 is sandwiched by the upper electrodes 16 (conductive film), the capacitance of the temperature compensation film 28 does not electrically contribute to the resonance characteristics. Therefore, the effective electromechanical coupling coefficient can be made high.

Furthermore, the area A1 of the temperature compensation film 28 within the resonance region 50 is different from the area A0 of the resonance region 50. Thus, varying the area ratio A1/A0 enables to control the temperature characteristics, including the temperature coefficient of frequency, and the electrical characteristics, including the resonance frequency and the effective electromechanical coupling coefficient, with respect to each of the resonators.

The upper electrode 16 may be used as conductive films formed on the upper and lower surfaces of the temperature compensation film 28 and mutually short-circuited. This enables to simplify the step of forming the conductive films.

The sixth embodiment can make the variation in height of the surface of the base for forming the piezoelectric film 14 small, and thus improve the orientation in forming the piezoelectric film 14 compared to the seventh and eighth embodiments described later.

Seventh Embodiment

Figure 21A:
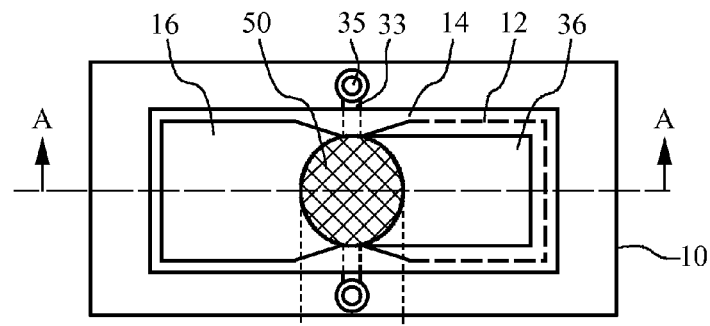
FIG. 21A is a plain view of a piezoelectric thin film resonator in accordance with a seventh embodiment.
Figure 21B:
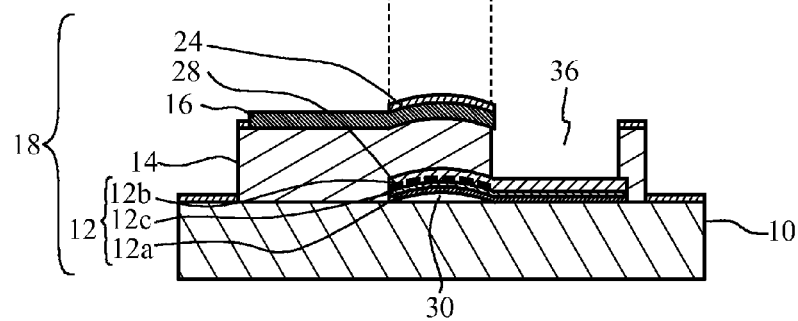
FIG. 21B and FIG. 21C are cross-sectional views taken along line A-A in FIG. 21A.
Figure 21C:
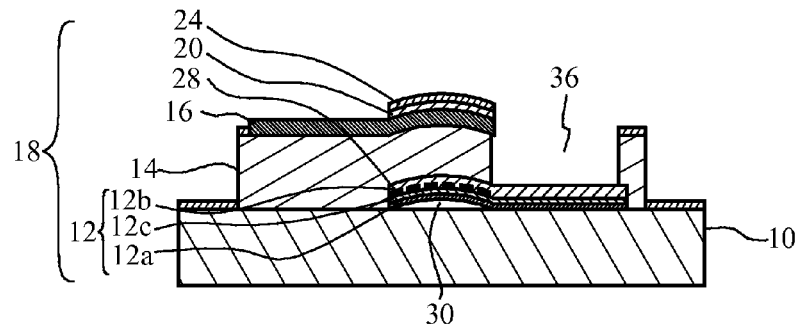

The seventh embodiment forms the temperature compensation film 28 in the lower electrode 12. FIG. 21A is a plain view of a piezoelectric thin film resonator in accordance with the seventh embodiment, and FIG. 21B and FIG. 21C are cross-sectional views taken along line A-A in FIG. 21A. FIG. 21B is a cross-sectional view of a series resonator in, for example, a ladder-type filter, and FIG. 21C is a cross-sectional view of a parallel resonator in the ladder-type filter. As illustrated in FIG. 21A through FIG. 21C, the lower electrode 12 includes the lower layer 12a, a middle layer 12c, and the upper layer 12b. The lower layer 12a is a Cr film for example, and the middle layer 12c and the upper layer 12b are Ru films for example. The temperature compensation film 28 is located between the middle layer 12c and the upper layer 12b of the lower electrode 12. The temperature compensation film 28 is not formed in the upper electrode 16. Other structures are the same as those of the sixth embodiment, and a description is omitted.

As described in the seventh embodiment, the lower electrode 12 may be used as conductive films formed on the upper and lower surfaces of the temperature compensation film 28 and mutually short-circuited. As described in the sixth and seventh embodiments, at least one of the lower electrode 12 and the upper electrode 16 may includes at least one of the conductive films formed on the upper and lower surfaces of the temperature compensation film 28 and mutually short-circuited. The eighth embodiment described later forms conductive films 26a and 26b separately from the formation of the upper electrode 16 and the lower electrode 12. The sixth and seventh embodiments can form the conductive films 26a and 26b as the upper electrode 16 or the lower electrode 12, and thus can decrease the number of fabrication steps. Furthermore, while the eighth embodiment forms the piezoelectric film 14 in multiple times, the sixth and seventh embodiments forms the piezoelectric film 14 in one time, and thus can decrease the number of fabrication steps.

Eighth Embodiment

Figure 22A:
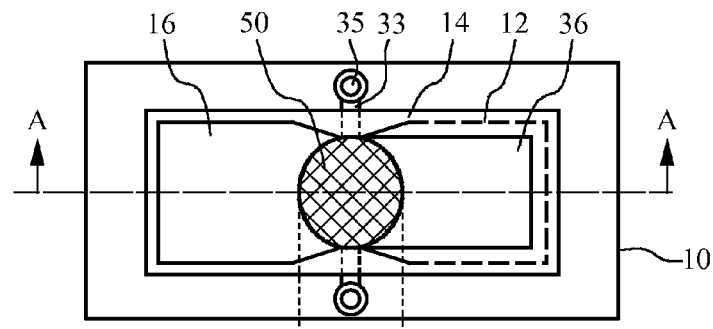
FIG. 22A is a plain view of a piezoelectric thin film resonator in accordance with an eighth embodiment.
Figure 22B:
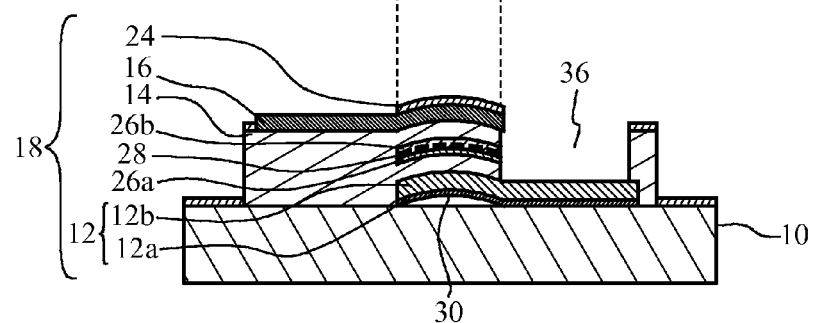
FIG. 22B and FIG. 22C are cross-sectional views taken along line A-A in FIG. 22A.
Figure 22C:
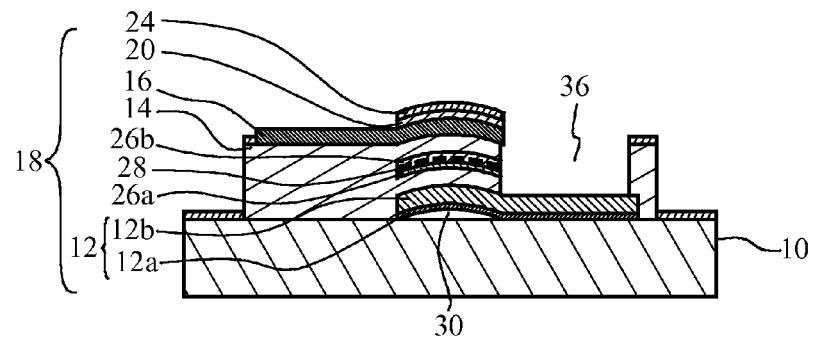

The eighth embodiment forms the temperature compensation film 28 in the piezoelectric film 14. FIG. 22A is a plain view of a piezoelectric thin film resonator in accordance with the eighth embodiment, and FIG. 22B and FIG. 22C are cross-sectional views taken along line A-A in FIG. 22A. FIG. 22B is a cross-sectional view of a series resonator in, for example, a ladder-type filter, and FIG. 22C is a cross-sectional view of a parallel resonator in the ladder-type filter. As illustrated in FIG. 22A through FIG. 22C, the temperature compensation film 28 is located in the piezoelectric film 14. The conductive films 26a and 26b are located on the lower and upper surfaces, respectively, of the temperature compensation film 28. The conductive films 26a and 26b are electrically short-circuited. The conductive films 26a and 26b are, for example, Ru films. Other structures are the same as those of the sixth embodiment, and a description is omitted.

In the eighth embodiment, the temperature compensation film 28 and the conductive films 26a and 26b are preferably arranged in a central portion of the piezoelectric film 14. This enables to make the film thickness of the temperature compensation film 28 thinnest to obtain the same temperature characteristics. The temperature compensation film 28 and the conductive films 26a and 26b may be arranged nearer the lower electrode 12 or the upper electrode 16 besides in the center portion of the piezoelectric film 14. In this case, the film thickness of the temperature compensation film 28 is set arbitrarily.

The eighth embodiment also allows the temperature compensation film 28 to elastically contribute to the resonance characteristics, and to reduce the temperature coefficient of frequency. As the temperature compensation film 28 is sandwiched by the conductive films 26a and 26b, the capacitance of the temperature compensation film 28 does not electrically contribute to the resonance characteristics. Therefore, the effective electromechanical coupling coefficient can be made high. Furthermore, varying the area ratio A1/A0 enables to control the temperature characteristics and the electrical characteristics with respect to each of the piezoelectric thin film resonators.

The conductive films 26a and 26b electrically float. For example, they float from ground. This allows the temperature compensation film 28 to be further electrically shielded. The conductive films 26a and 26b preferably include a film made of the same material as that of the film included in at least one of the lower electrode 12 and the upper electrode 16 in order to reduce the production cost. Furthermore, the conductive films 26a and 26b preferably have a Young's modulus greater than that of aluminum in order to make the effective electromechanical coupling coefficient high. The conductive films 26a and 26b preferably mainly include at least one of Ir, Ru, Rh, W, Mo, Cr, Ta, Pt, Ti, and Cu, which has a Young's modulus greater than that of aluminum.

Ninth Embodiment

Figure 23A:
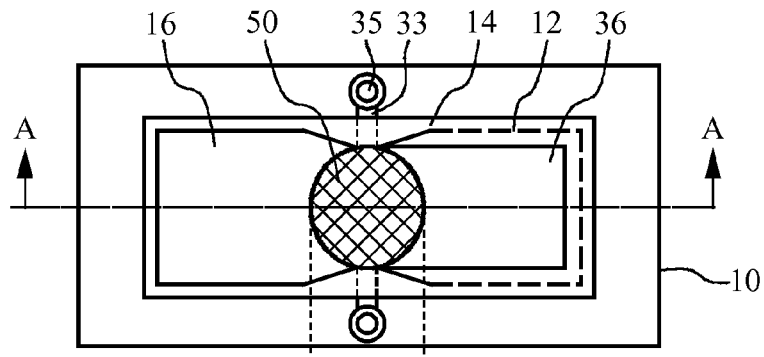
FIG. 23A is a plain view of a piezoelectric thin film resonator in accordance with a ninth embodiment.
Figure 23B:
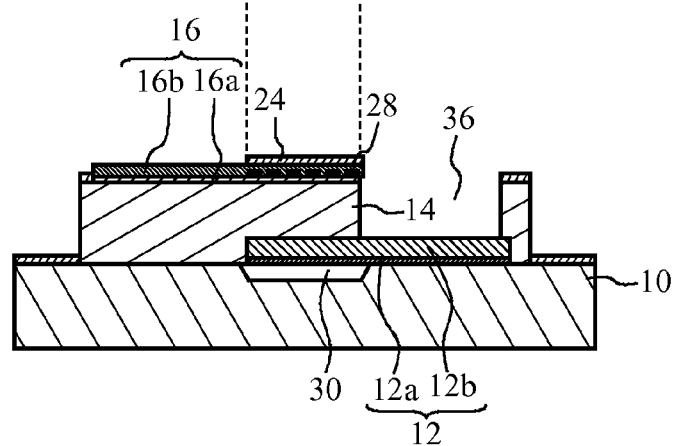
FIG. 23B and FIG. 23C are cross-sectional views taken along line A-A in FIG. 23A.
Figure 23C:
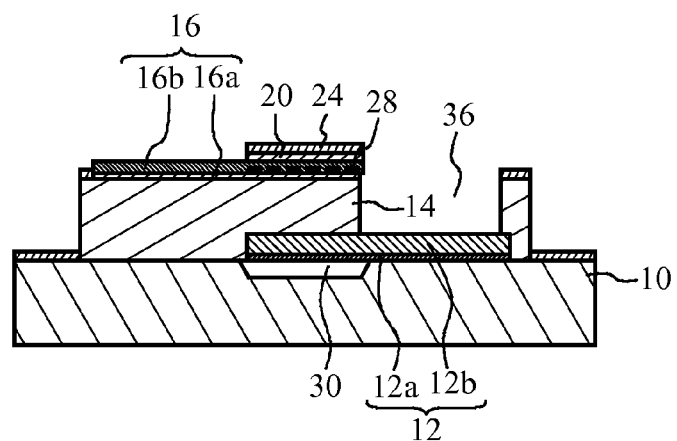

A ninth embodiment changes a structure of the space. FIG. 23A is a plain view of a piezoelectric thin film resonator in accordance with the ninth embodiment, and FIG. 23B and FIG. 23C are cross-sectional views taken along line A-A in FIG. 23A. FIG. 23B is a cross-sectional view of a series resonator in, for example, a ladder-type filter, and FIG. 23C is a parallel resonator in the ladder-type filter. As illustrated in FIG. 23A through FIG. 23C, a recessed portion is formed on the upper surface of the substrate 10. The lower electrode 12 is flatly formed on the substrate 10. This forms the space 30 in the recessed portion of the substrate 10. The space 30 is formed in the resonance region 50. Other structures are the same as those of the sixth embodiment, and a description is omitted. The space 30 may be formed so as to pierce through the substrate 10. The temperature compensation film 28 may be located in the lower electrode 12 in the ninth embodiment as with the seventh embodiment. The temperature compensation film 28 and the conductive films 26a and 26b may be located in the piezoelectric film 14 in the same manner as those of the eighth embodiment.

Figure 24A:
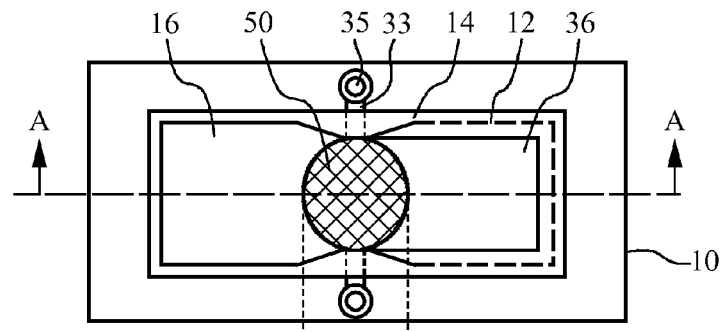
FIG. 24A is a plain view of a piezoelectric thin film resonator in accordance with a variation of the ninth embodiment.
Figure 24B:
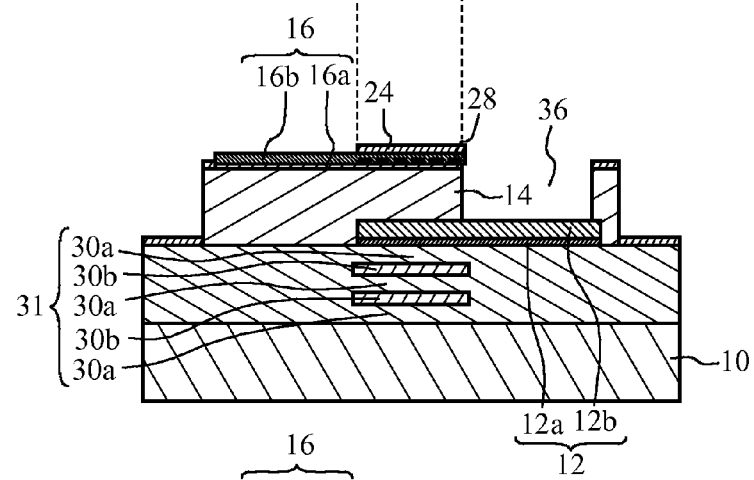
FIG. 24B and FIG. 24C are cross-sectional views taken along line A-A in FIG. 24A.
Figure 24C:
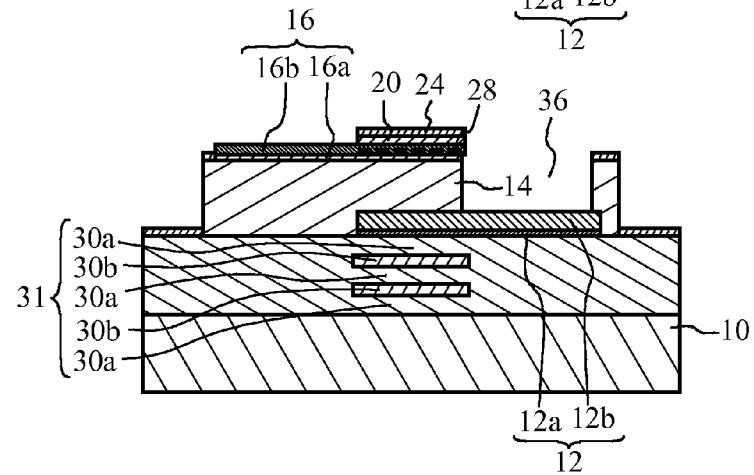

A variation of the ninth embodiment provides an acoustic reflection film instead of the space. FIG. 24A is a plain view of a piezoelectric thin film resonator in accordance with the variation of the ninth embodiment, and FIG. 24B and FIG. 24C are cross-sectional views taken along line A-A in FIG. 24A. FIG. 24B is a cross-sectional view of a series resonator in, for example, a ladder-type filter, and FIG. 24C is a cross-sectional view of a parallel resonator in the ladder-type filter. As illustrated in FIG. 24A through FIG. 24C, the acoustic reflection film 31 is formed below the lower electrode 12 in the resonance region 50. The acoustic reflection film 31 is formed by alternately stacking a film 30a having a low acoustic impedance and a film 30b having a high acoustic impedance. Each of the films 30a and 30b has a film thickness of λ/4 (λ is the wavelength of the acoustic wave). The number of stacked films 30a and 30b can be set arbitrarily. Other structures are the same as those of the sixth embodiment, and a description is omitted. The temperature compensation film 28 may be located in the lower electrode 12 in the variation of the ninth embodiment as with the seventh embodiment. The temperature compensation film 28 and the conductive films 26a and 26b may be located in the piezoelectric film 14 in the same manner as those of the eighth embodiment.

As described in the sixth through ninth embodiments, the piezoelectric thin film resonator may be a Film Bulk Acoustic Resonator (FBAR) having the space 30 formed between the substrate 10 and the lower electrode 12 in the resonance region 50. In addition, as described in the variation of the ninth embodiment, the piezoelectric thin film resonator may be a Solidly Mounted Resonator (SMR) including the acoustic reflection film 31, which reflects the acoustic wave propagated through the piezoelectric film 14, below the lower electrode 12 in the resonance region 50.

The resonance region 50 has an ellipsoidal shape in the sixth through ninth embodiments, but may have other shapes.

Tenth Embodiment

Figure 25:
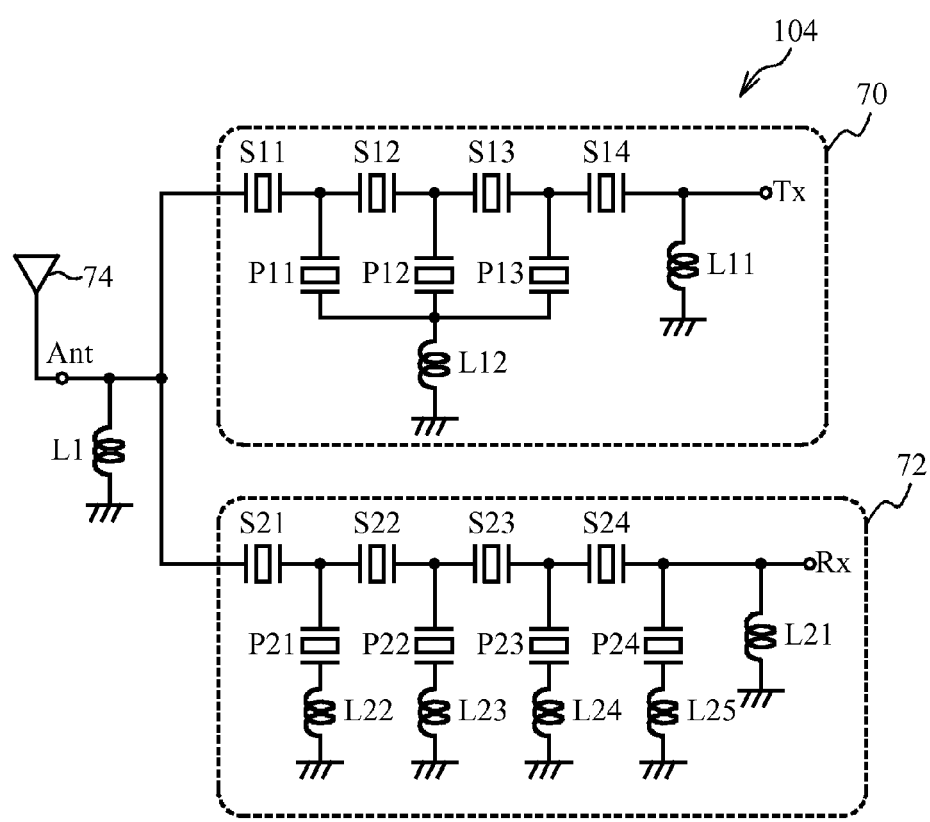
FIG. 25 is a circuit diagram of a duplexer in accordance with a tenth embodiment.

A tenth embodiment is an exemplary duplexer as an acoustic wave device. FIG. 25 is a circuit diagram of a duplexer in accordance with the tenth embodiment. As illustrated in FIG. 25, a duplexer 104 includes a transmission filter 70 and a reception filter 72. The transmission filter 70 is connected between a common terminal Ant and a transmission terminal Tx. The reception filter 72 is connected between the common terminal Ant and a reception terminal Rx.

The transmission filter 70 includes series resonators S11 through S14 and parallel resonators P11 through P13. The series resonators S11 through S14 are connected in series between the common terminal Ant and the transmission terminal Tx. The parallel resonators P11 through P13 are connected in parallel between the common terminal Ant and the transmission terminal Tx. Ground side ends of the parallel resonators P11 through P13 are unified and connected to ground through an inductor L12. The transmission terminal Tx is connected to ground through an inductor L11. The number of series resonators, parallel resonators and inductors can be arbitrarily changed to obtain desired transmission filter characteristics.

The reception filter 72 includes series resonators S21 through S24 and parallel resonators P21 through P24. The series resonators S21 through S24 are connected in series between the common terminal Ant and the reception terminal Rx. The parallel resonators P21 through P24 are connected in parallel between the common terminal Ant and the reception terminal Rx. Ground side ends of the parallel resonators P21 through P24 are connected to ground through respective inductors L22 through L25. The reception terminal Rx is connected to ground through an inductor L21. The number of series resonators, parallel resonators and inductors can be arbitrarily changed to obtain desired reception filter characteristics.

The common terminal Ant is connected to an antenna 74. The common terminal Ant is connected to ground through an inductor L1. The inductor L1 functions as a matching circuit. The matching circuit may have multiple elements instead of the inductor L1.

The piezoelectric thin film resonator of at least one of the six through ninth embodiments and their variations is used for at least one of the series resonators S11 through S14, S21 through S24, parallel resonators P11 through P13, and P21 through P24. For example, all the series resonators and the parallel resonators may be the piezoelectric thin film resonators of the sixth through ninth embodiments and their variation. In addition, one of the transmission filter 70 and the reception filter 72 may be a surface acoustic wave filter. The surface acoustic wave filter may be a multimode filter for example. The reception filter 72 may be a balanced output. When the reception filter 72 is a balanced output, a Double Mode SAW (DMS) filter can be used as the reception filter 72.

A duplexer characteristic to a specification of Wide-band Code Division Multiple Access (WCDMA) Band 25 is examined using the piezoelectric thin film resonator of the six embodiment for the resonator in the duplexer 104 illustrated in FIG. 25. Band 25 has a transmission band of 1850 to 1915 MHz, and a reception band of 1930 to 1995 MHz.

Three types of reception filters: types A, B, and C are simulated. Table 1 presents the area ratio A1/A0 of the area of the temperature compensation film 28 to the area of the resonance region 50 in each of resonators of types A, B, and C.

TABLE 1

| | RESONATOR | | | | | | | |
|---|---|---|---|---|---|---|---|---|
| | S21 | S22 | S23 | S24 | P21 | P22 | P23 | P24 |
| TYPE A | 1 | 1 | 1 | 1 | 1 | 1 | 1 | 1 |
| TYPE B | 0.76 | 0.79 | 0.82 | 0.80 | 1 | 1 | 1 | 1 |
| TYPE C | 0.64 | 0.66 | 0.63 | 0.64 | 0.88 | 0.83 | 0.84 | 0.86 |

As presented in Table 1, the type A is a comparative example, and the area ratio A1/A0 is 1 in all the resonators. In the type B, each of the parallel resonators has an area ratio A1/A0 of 1, and the series resonators have area ratios A1/A0 equal to or lower than 1 and different from each other. In the type C, the series resonators and the parallel resonators have area ratios A1/A0 equal to or lower than 1, the series resonators have area ratios A1/A0 different from each other, and the parallel resonators have area ratios A1/A0 different from each other. Furthermore, the series resonators have area ratios A1/A0 different from those of the parallel resonators. The highest area ratio A1/A0 of the series resonators is lower than the lowest area ratio A1/A0 of the parallel resonators.

Table 2 presents materials of films in the multilayered film 18, and film thicknesses of the films in each type.

TABLE 2

Unit: nm

| | FREQUENCY ADJUSTING FILM 20 | MASS LOAD FILM 24 | UPPER LAYER 16b OF UPPER ELECTRODE | TEMPERATURE COMPENSATION FILM 28 |
|---|---|---|---|---|
| MATERIAL | SiO$_2$ | Cr | Ru | SiO$_2$ |
| TYPE A | 30 | 40 | 190 | 90 |
| TYPE B | 30 | — | 190 | 115 |
| TYPE C | 30 | — | 195 | 115 |

| | LOWER LAYER 16a OF UPPER ELECTRODE | PIEZOELECTRIC FILM 14 | UPPER LAYER 12b OF LOWER ELECTRODE | LOWER LAYER 12a OF LOWER ELECTRODE |
|---|---|---|---|---|
| MATERIAL | Ru | AlN | Ru | Cr |
| TYPE A | 20 | 1180 | 175 | 85 |
| TYPE B | 20 | 1180 | 170 | 85 |
| TYPE C | 20 | 1210 | 175 | 85 |

When the area ratio A1/A0 is changed, the resonance frequency shifts. As presented in Table 2, to make the resonance frequency a desired value, changed are the film thicknesses of the upper layer 16b of the upper electrode 16, the temperature compensation film 28, the piezoelectric film 14, and the upper layer 12b of the lower electrode 12. The types B and C do not use the mass load film 20 because a difference in resonance frequency between the series resonators and the parallel resonators can be formed using a difference in area ratio A1/A0.

Table 3 lists resonance frequencies of the resonators.

TABLE 3

Unit: MHz

| RESONATOR | | | | | | | |
|---|---|---|---|---|---|---|---|
| S21 | S22 | S23 | S24 | P21 | P22 | P23 | P24 |

| | S21 | S22 | S23 | S24 | P21 | P22 | P23 | P24 |
|---|---|---|---|---|---|---|---|---|
| TYPE A | 1972 | 1972 | 1972 | 1972 | 1917 | 1917 | 1917 | 1917 |
| TYPE B | 1982 | 1973 | 1964 | 1971 | 1914 | 1914 | 1914 | 1914 |
| TYPE C | 1970 | 1965 | 1972 | 1971 | 1905 | 1918 | 1915 | 1910 |

Table 4 lists temperature coefficients of frequencies of the resonators. The temperature coefficient of frequency represents a shift amount of the resonance frequency per temperature in Table 4.

TABLE 4

Unit: ppm/° C.

| | S21 | S22 | S23 | S24 | P21 | P22 | P23 | P24 |
|---|---|---|---|---|---|---|---|---|
| TYPE A | −15.5 | −15.5 | −15.7 | −15.5 | −15.2 | −14.7 | −14.9 | −15.2 |
| TYPE B | −15.9 | −15.2 | −14.6 | −14.8 | −11.8 | −11.8 | −11.8 | −12.0 |
| TYPE C | −18.1 | −17.9 | −18.1 | −17.9 | −14.0 | −14.7 | −14.7 | −14.3 |

As presented in Table 3 and Table 4, the resonance frequency increases and the temperature coefficient of frequency deteriorates as the area ratio A1/A0 decreases. Furthermore, the temperature coefficient of frequency is in a trade-off relationship with the effective electromechanical coupling coefficient. Therefore, the effective electromechanical coupling coefficient increases as the area ratio A1/A0 decreases. As described above, making the resonators have different area ratios A1/A0 enables to control the resonance characteristics and the temperature characteristics with respect to each of the resonators.

Figure 26A:
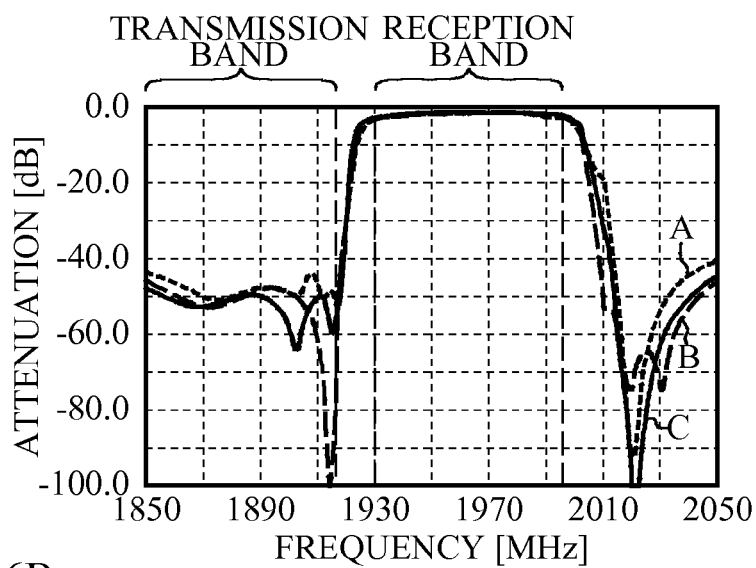
FIG. 26A is a diagram illustrating a pass characteristic of a reception filter.
Figure 26B:
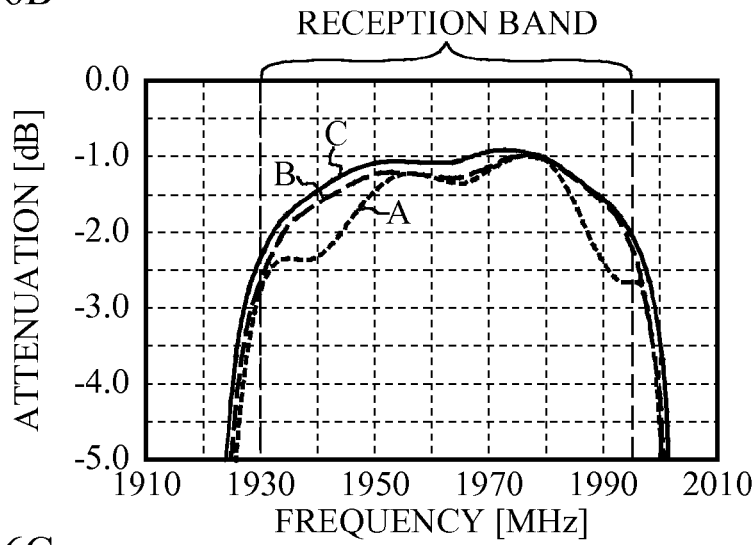
FIG. 26B is an enlarged view of the pass characteristic around a reception band.
Figure 26C:
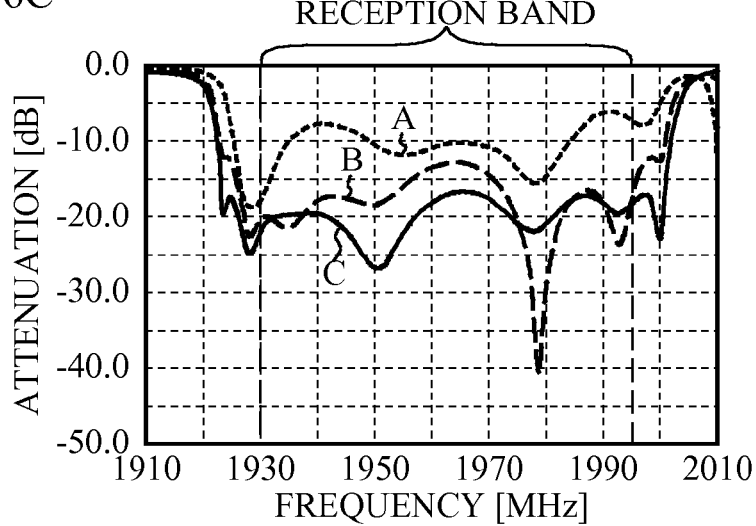
FIG. 26C is a diagram illustrating a return loss of a signal from an antenna around the reception band.

FIG. 26A is a diagram illustrating a pass characteristic of a reception filter, FIG. 26B is an enlarged view of the pass characteristic around a reception band, and FIG. 26C is a diagram illustrating a return loss of a signal from the antenna around the reception band. In FIG. 26A through FIG. 26C, a dotted line indicates the type A, a dashed line indicates the type B, and a solid line indicates the type C. As illustrated in FIG. 26A and FIG. 26B, the matching at the center of the reception band is improved in order of the types A, B, and C. In addition, a loss within the reception band is improved in order of the types A, B, and C. Furthermore, when compared as the skirt characteristic at a low frequency side of the reception band, transition widths between frequencies, at which the attenuation transits from −2.5 to −48 dB, are 14.4 MHz, 12.9 MHz, and 11.1 MHz in the types A, B, and C respectively. As described above, the skirt characteristic is improved in order of the types A, B, and C. As illustrated in FIG. 26C, the return loss is improved in order of the types A, B, and C.

Figure 27A:
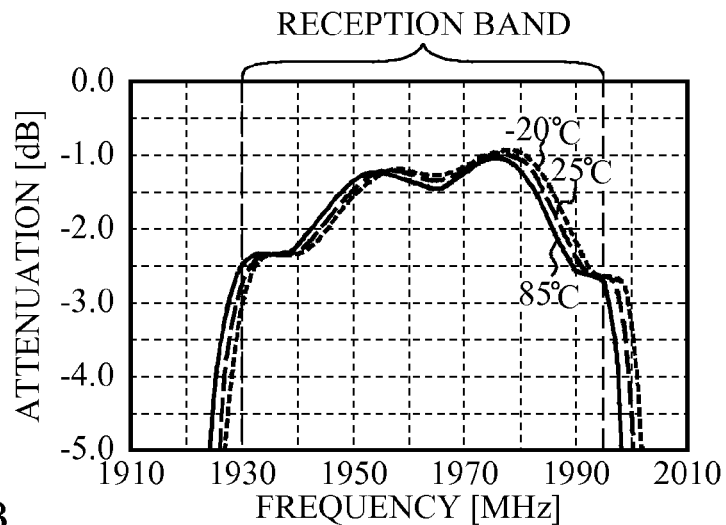
FIGS. 27A, 27B, and 27C are diagrams illustrating pass characteristics at various temperatures in types A, B, and C respectively.
Figure 27B:
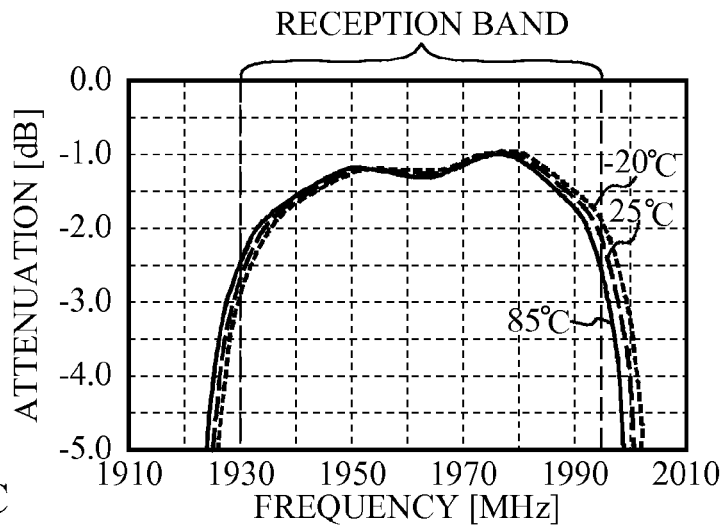
Figure 27C:
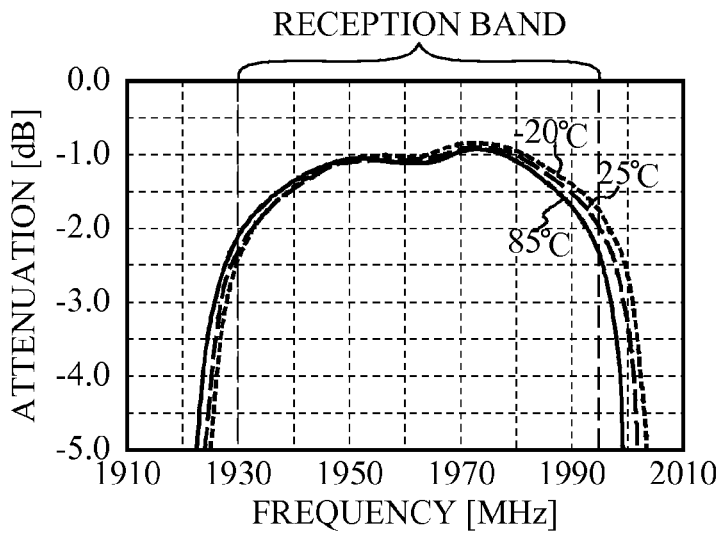

FIG. 27A through FIG. 27C are diagrams illustrating pass characteristics at various temperatures in the types A, B, and C. In FIGS. 27A, 27B, and 27C, a dotted line, a dashed line and a solid line indicate pass characteristics at −20, 25, and 85° C. respectively. As illustrated in FIG. 27A through FIG. 27C, the temperature characteristics are improved in the types B and C compared to the type A. For example, differences in loss between −25 and 85° C. at 1930 MHz, which is a frequency at the guard band side, are 0.59 dB, 0.42 dB, and 0.44 dB in the types A, B, and C respectively.

Simulations are conducted on four types of transmission filters: types D, E, F, and G. Table 5 presents the area ratio A1/A0 of the area of the temperature compensation film 28 to the area of the resonance region 50 in the resonators included in the transmission filters of the types D through G.

TABLE 5

| | RESONATOR | | | | | | |
|---|---|---|---|---|---|---|---|
| | S11 | S12 | S13 | S14 | P11 | P12 | P13 |
| TYPE D | 1 | 1 | 1 | 1 | 1 | 1 | 1 |
| TYPE E | 1 | 1 | 1 | 1 | 0.48 | 0.45 | 0.48 |
| TYPE F | 0.82 | 0.82 | 0.83 | 0.86 | 0.86 | 0.82 | 0.85 |
| TYPE G | 0.64 | 0.66 | 0.65 | 0.68 | 0.90 | 0.86 | 0.88 |

As presented in Table 5, the type D is a comparative example, and the area ratio A1/A0 is 1 in all the resonators. In the type E, the series resonators have area ratios A1/A0 of 1, the parallel resonators have area ratios A1/A0 lower than or equal to 1 and different from each other. In the types F and G, the series resonators and the parallel resonators have area ratios A1/A0 lower than or equal to 1, the series resonators have area ratios A1/A0 different from each other, and the parallel resonators have area ratios A1/A0 different from each other. In the type F, the series resonators have area ratios A1/A0 approximately equal to those of the parallel resonators. In the type G, the series resonators have area ratios A1/A0 different from those of the parallel resonators.

Table 6 lists materials of films in the multilayered film 18, and film thicknesses of the films in each type.

TABLE 6

Unit: nm

| | FREQUENCY ADJUSTING FILM 20 | MASS LOAD FILM 24 | UPPER LAYER 16b OF UPPER ELECTRODE | TEMPERATURE COMPENSATION FILM 28 |
|---|---|---|---|---|
| MATERIAL | SiO$_2$ | Cr | Ru | SiO$_2$ |
| TYPE D | 30 | 40 | 200 | 100 |
| TYPE E | 30 | 160 | 195 | 115 |
| TYPE F | 30 | 40 | 200 | 115 |
| TYPE G | 30 | — | 205 | 115 |

TABLE 6-continued

Unit: nm

| | LOWER LAYER 16a OF UPPER ELECTRODE | PIEZOELECTRIC FILM 14 | UPPER LAYER 12b OF LOWER ELECTRODE | LOWER LAYER 12a OF LOWER ELECTRODE |
|---|---|---|---|---|
| MATERIAL | Ru | AlN | Ru | Cr |
| TYPE D | 20 | 1230 | 180 | 85 |
| TYPE E | 20 | 1195 | 175 | 85 |
| TYPE F | 20 | 1230 | 180 | 85 |
| TYPE G | 20 | 1265 | 185 | 90 |

As presented in Table 6, to make the resonance frequency have a desired value, changed are the film thicknesses of the upper layer 16b of the upper electrode 16, the temperature compensation film 28, the piezoelectric film 14, and the upper layer 12b and the lower layer 12a of the lower electrode 12. In the type E, the film thickness of the mass load film 20 is made to be thicker than that of the type D because the area ratios A1/A0 of the parallel resonators are made to be lower than 1. In the type F, since the series resonators have area ratios A1/A0 approximately equal to those of the parallel resonators, the film thickness of the mass load film 20 is equal to that of the type D. In the type G, the mass load film 20 is not used because a difference in resonance frequency between the series resonator and the parallel resonator can be formed with a difference in area ratio A1/A0.

Figure 28A:
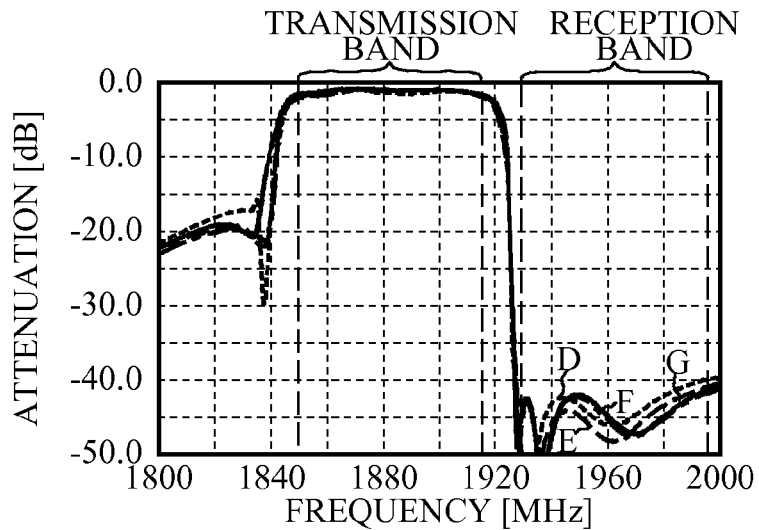
FIG. 28A is a diagram illustrating a pass characteristic of a transmission filter.
Figure 28B:
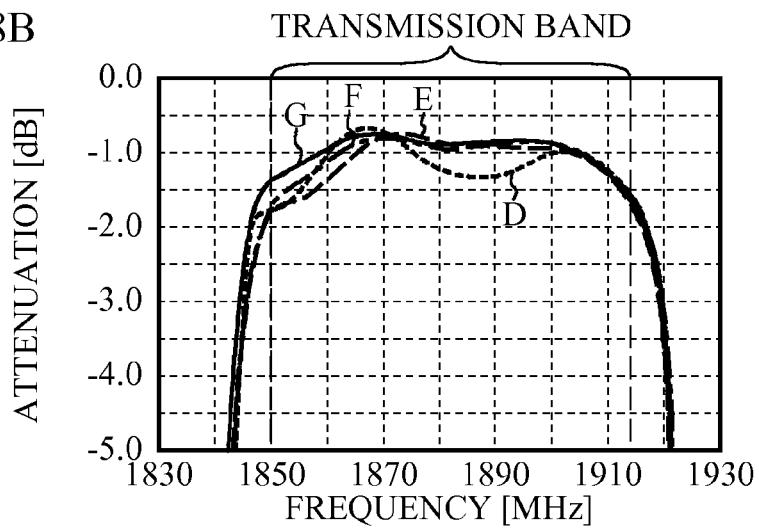
FIG. 28B is an enlarged view of the pass characteristics around a transmission band.
Figure 28C:
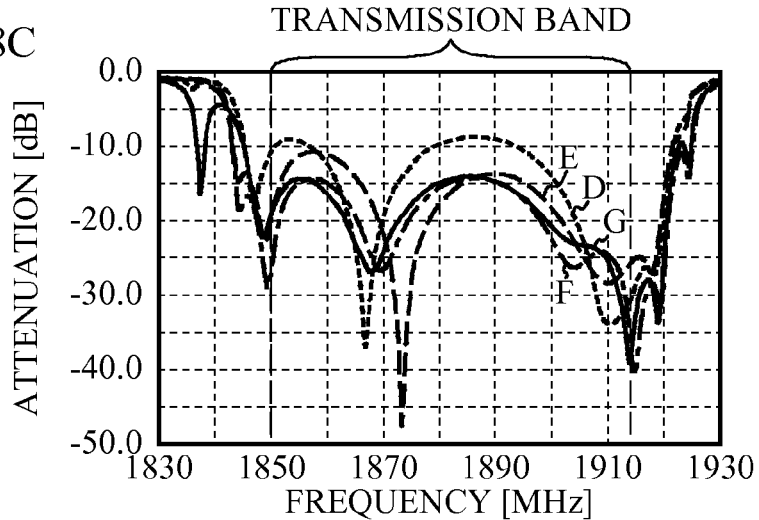
FIG. 28C is a diagram illustrating a return loss of a signal from the antenna around the transmission band.
Figure 29A:
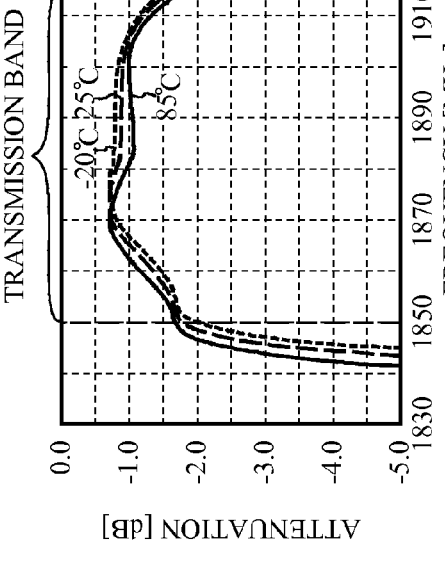
FIGS. 29A, 29B, 29C, and 29D are diagrams illustrating pass characteristics at various temperatures in types D, E, F, and G respectively.
Figure 29B:
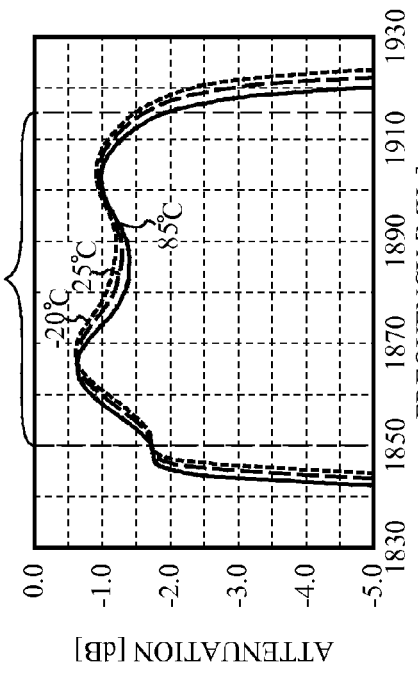
Figure 29C:
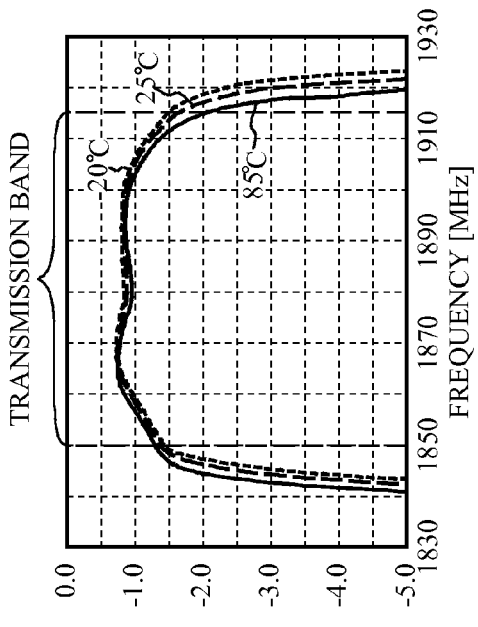
Figure 29D:
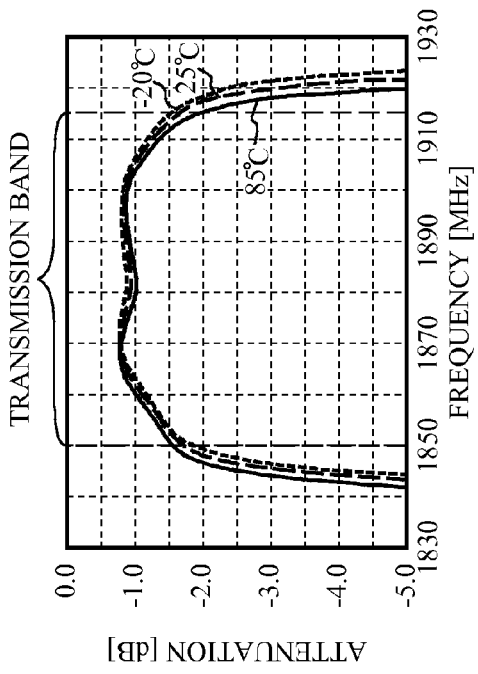

FIG. 28A is a diagram illustrating a pass characteristic of a transmission filter, FIG. 28B is an enlarged view of the pass characteristic around a transmission band, and FIG. 28C is a diagram illustrating a return loss of a signal from the antenna around the transmission band. In FIG. 28A through FIG. 28C, a dotted line indicates the type D, a dashed line indicates the type E, a dashed-dotted line indicates the type F, and a solid line indicates the type G. As illustrated in FIG. 28A and FIG. 28B, the matching at the center of the transmission band is improved in the types E, F, and G compared to the type D. In addition, the matching at a low frequency side of the transmission band is improved in the types F and G. A loss at the center of the transmission band is improved in the types E, F, and G compared to the type D. Furthermore, the loss at a low frequency side of the transmission band is improved in the type G.

FIGS. 29A, 29B, 29C, and 29D are diagrams illustrating pass characteristics at various temperatures in the types D, E, F, and G respectively. In FIG. 29A through FIG. 29D, a dotted line, a dashed line, and a solid line indicate pass characteristics at −20, 25, and 85° C. respectively. As illustrated in FIG. 29A through FIG. 29D, differences in loss between −25 and 85° C. at 1915 MHz, which is a frequency at the guard band side, are 0.44 dB, 0.37 dB, 0.38 dB, and 0.45 dB in the types D, E, F, and G respectively. As described above, the temperature characteristics are improved in the types E and F compared to the type D.

The tenth embodiment makes the acoustic wave device include piezoelectric thin film resonators having area ratios A1/A0 that are lower than 1 and higher than 0, and different from each other. This enables to control the resonance characteristics and temperature characteristics with respect to each of the resonators. Therefore, the tenth embodiment enables to improve the electrical characteristics and temperature characteristics of the acoustic wave device.

The transmission filter 70 and the reception filter 72 of the tenth embodiment include the piezoelectric thin film resonators having area ratios A1/A0 that are lower than 1 and higher than 0, and different from each other. For example, at least two piezoelectric thin film resonators may have area ratios A1/A0 that are lower than 1 and higher than 0, and different from each other. This enables to improve the loss and the temperature characteristics within the passbands of the transmission filter 70 and the reception filter 72.

In addition, when at least one of the transmission filter 70 and the reception filter 72 is a ladder-type filter, the series resonator and the parallel resonator may include piezoelectric thin film resonators having area ratios A1/A0 that are lower than 1 and higher than 0, and different from each other. Also, the series resonators may have area ratios A1/A0 of 1, and the parallel resonators may have area ratios A1/A0 that are lower than 1 and higher than 0, and different from each other. The parallel resonators may have area ratios A1/A0 of 1, and the series resonators may have area ratios A1/A0 that are lower than 1 and higher than 0, and different from each other. The series resonators may have area ratios A1/A0 that are lower than 1 and higher than 0, and different from each other, and the parallel resonators may have area ratios A1/A0 that are lower than 1 and higher than 0, and different from each other.

For example, the skirt characteristic at the guard band side preferably changes little with temperature in the reception filter 72 and the transmission filter 70. For example, when a guard band is narrow like Band 25 (the transmission band is 1850 to 1915 MHz, and the reception band is 1930 to 1995 MHz), the skirt characteristic preferably changes little with temperature. Therefore, the parallel resonator preferably has a large area ratio A1/A0 in a filter having a higher passband out of the reception filter 72 and the transmission filter 70. The series resonator preferably has a high area ratio A1/A0 in a filter having a lower passband out of the reception filter 72 and the transmission filter 70. Furthermore, the effective electromechanical coupling coefficient is preferably high to widen the width of the passband. Therefore, the area ratio of the series resonator is preferably reduced in the filter having the higher passband. The area ratio of the parallel resonator is preferably reduced in the filter having the lower passband.

Furthermore, both of the series resonator and the parallel resonator may have area ratios A1/A0 lower than 1 as with the types C, F, and G.

The difference in resonance frequency between the series resonator and the parallel resonator can be formed with the difference in area ratio A1/A0 between the series resonator and the parallel resonator. This enables to omit the mass load film 20.

Eleventh Embodiment

Figure 30:
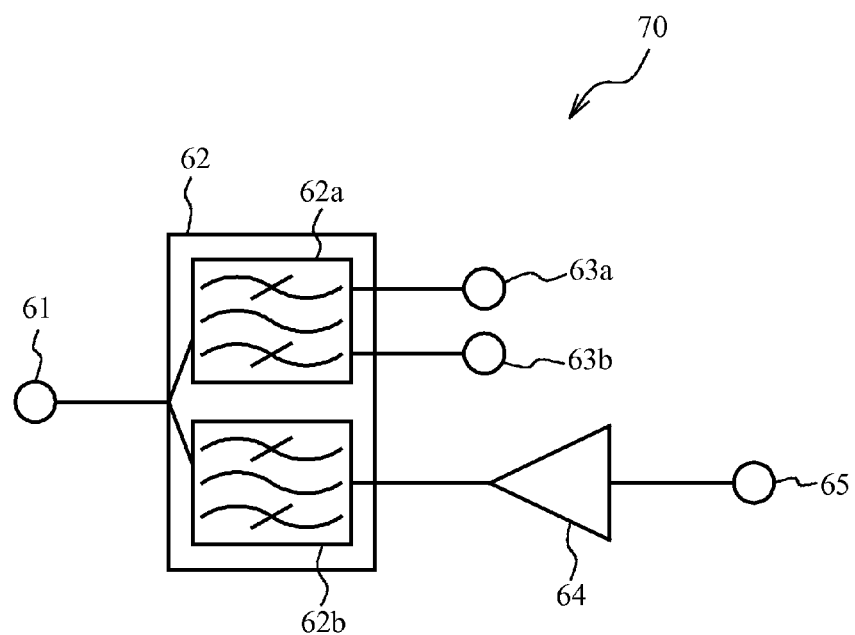
FIG. 30 is a block diagram of a module in accordance with an eleventh embodiment.

An eleventh embodiment is an exemplary Radio Frequency (RF) module for mobile communication. FIG. 30 is a block diagram of a module in accordance with the eleventh embodiment. As illustrated in FIG. 30, a module 70 includes a duplexer 62 and a power amplifier 64. The duplexer 62 includes a reception filter 62a and a transmission filter 62b. The reception filter 62a is connected between an antenna terminal 61 and reception terminals 63a and 63b. The reception filter 62a passes signals in a reception band out of signals input from the antenna terminal 61, and suppresses other signals. The signals in the reception band are output from the reception terminals 63a and 63b. Balanced signals are output from the reception terminals 63a and 63b. The transmission filter 62b is connected between the power amplifier 64 and the antenna terminal 61. The transmission filter 62b passes signals in a transmission band out of signals input from the power amplifier 64, and suppresses other signals. The signals in the transmission band are output from the antenna terminal 61. The power amplifier 64 amplifies signals input from a transmission terminal 65, and outputs them to the transmission filter 62b. At least one of the reception filter 62a and transmission filter 62b can include the filter of the fifth embodiment.

When configured with a longitudinally coupled double-mode surface acoustic wave filter, the reception filter 62a can obtain an output having a phase difference of 180 degrees simply by changing an arrangement of the electrode fingers, and easily obtain a balanced output. When the duplexer 62 uses a double-mode filter having a surface acoustic wave filter for the reception filter 62a, and a filter, in which piezoelectric thin film resonators of first through fourth embodiments are connected in a ladder shape, for the transmission filter 62b, a balanced output can be obtained at a reception side, and a filter having high power durability is achieved.

The acoustic wave devices of the first through tenth embodiments are used in the RF module in the eleventh embodiment, but may be used in other modules.

Although the embodiments of the present invention have been described in detail, it is to be understood that the various change, substitutions, and alterations could be made hereto without departing from the spirit and scope of the invention.

What is claimed is:

1. An acoustic wave device comprising:
a piezoelectric thin film resonator including:
   a substrate;
   a lower electrode formed on the substrate;
   at least two piezoelectric films formed on the lower electrode;
   an insulating film sandwiched by the at least two piezoelectric films; and
   an upper electrode formed on the at least two piezoelectric films, wherein
   an area of the insulating film within a resonance region, in which the lower electrode and the upper electrode face each other across the at least two piezoelectric films, is different from an area of the resonance region.

2. An acoustic wave device comprising:
a piezoelectric thin film resonator including:
   a substrate;
   a lower electrode formed on the substrate;
   at least two piezoelectric films formed on the lower electrode;
   an insulating film sandwiched by the at least two piezoelectric films; and
   an upper electrode formed on the at least two piezoelectric films, wherein
   the insulating film within a resonance region, in which the lower electrode and the upper electrode face each other across the at least two piezoelectric films, has a concave portion and a convex portion.

3. The acoustic wave device according to claim 1, wherein the insulating film has a temperature coefficient of elastic constant opposite in sign to a temperature coefficient of elastic constant of the at least two piezoelectric films.

4. The acoustic wave device according to claim 1, wherein the acoustic wave device includes a plurality of the piezoelectric thin film resonators having area ratios different from each other, the area ratio being a ratio of the area of the insulating film within the resonance region to the area of the resonance region.

5. The acoustic wave device according to claim 4, wherein the plurality of the piezoelectric thin film resonators include series resonators and parallel resonators of a filter, and
at least one of the series resonators has the area ratio different from the area ratio of at least one of the parallel resonators.

6. The acoustic wave device according to claim 4, wherein the plurality of the piezoelectric thin film resonators include series resonators and parallel resonators of a filter, and
at least one of the series resonators has the area ratio different from the area ratio of another of the series resonators and/or at least one of the parallel resonators has the area ratio different from the area ratio of another of the parallel resonators.

7. The acoustic wave device according to claim 1, wherein at least a part of an outer periphery of an uppermost piezoelectric film out of the at least two piezoelectric films in the resonance region is located further in than an outer periphery of the upper electrode.

8. The acoustic wave device according to claim 7, wherein a space or an acoustic reflection film is located below the lower electrode, and
an outer periphery of the space or an outer periphery of the acoustic reflection film is located further out than the outer periphery of the upper electrode in a region in which the outer periphery of the uppermost piezoelectric film is formed further in than the outer periphery of the upper electrode.

9. The acoustic wave device according to claim 7, wherein a space is located below the lower electrode, and
an outer periphery of the space is located further out than the outer periphery of the upper electrode, and further in than an outer periphery of a lowermost piezoelectric film in a region in which the outer periphery of the uppermost piezoelectric film is formed further in than the outer periphery of the upper electrode.

10. The acoustic wave device according to claim 1, wherein the at least two piezoelectric films mainly include aluminum nitride, and the insulating film mainly includes silicon oxide.

11. An acoustic wave device comprising:
a piezoelectric thin film resonator including:
   a substrate;
   a piezoelectric film located on the substrate;
   a lower electrode and an upper electrode that face each other across the piezoelectric film;
   a temperature compensation film having a temperature coefficient of elastic constant opposite in sign to a temperature coefficient of elastic constant of the piezoelectric film; and
   conductive films formed on an upper surface and a lower surface of the temperature compensation film, and mutually electrically short-circuited, wherein
   an area of the temperature compensation film within a resonance region, in which the lower electrode and the upper electrode facing each other across the piezoelectric film, is different from an area of the resonance region.

12. The acoustic wave device according to claim 11, wherein
at least one of the lower electrode and the upper electrode includes at least one of the conductive films.

13. The acoustic wave device according to claim 11, wherein
the temperature compensation film mainly includes silicon oxide or silicon nitride.

14. The acoustic wave device according to claim 11, wherein
the temperature compensation film mainly includes silicon oxide, and additionally includes at least one of F, H, $CH_3$, $CH_2$, Cl, C, N, P and S.

15. The acoustic wave device according to claim 11, wherein
a space is formed between the substrate and the lower electrode in the resonance region.

16. The acoustic wave device according to claim 11, further comprising:
an acoustic reflection film, which reflects an acoustic wave propagated through the piezoelectric film, below the lower electrode in the resonance region.

17. The acoustic wave device according to claim 11, wherein
the temperature compensation film has a tapered side surface so as to have an upper surface with a width smaller than that of a lower surface.

18. The acoustic wave device according to claim 11, wherein
the acoustic wave device includes a plurality of the piezoelectric thin film resonators having area ratios different from each other, where the area ratio is a ratio of the area of the temperature compensation film within the resonance region to the area of the resonance region.

19. The acoustic wave device according to claim 18, further comprising:
a filter including a plurality of the piezoelectric thin film resonators.

20. The acoustic wave device according to claim 19, further comprising
a duplexer including the filter.

* * * * *